US008423307B2

(12) United States Patent
Nakamura

(10) Patent No.: US 8,423,307 B2
(45) Date of Patent: Apr. 16, 2013

(54) APPARATUS FOR ANALYSIS AND EVALUATION OF CHARACTERISTICS OF SERIES-CONNECTED SOLAR BATTERY CELLS

(75) Inventor: Hideyo Nakamura, Matsumoto (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 260 days.

(21) Appl. No.: 13/026,009

(22) Filed: Feb. 11, 2011

(65) Prior Publication Data

US 2011/0257912 A1 Oct. 20, 2011

(30) Foreign Application Priority Data

Apr. 20, 2010 (JP) ................................ 2010-096751
Jun. 22, 2010 (JP) ................................ 2010-141910

(51) Int. Cl.
*G01R 31/36* (2006.01)
*G06F 11/30* (2006.01)

(52) U.S. Cl.
USPC ................ 702/63; 702/81; 702/181; 702/182

(58) Field of Classification Search ............. 702/63–65, 702/182–188, 81–84
See application file for complete search history.

(56) References Cited

U.S. PATENT DOCUMENTS 4,981,525 A * 1/1991 Kiyama et al. ................ 136/244

FOREIGN PATENT DOCUMENTS

| | | | | |
|---|---|---|---|---|
| DE | 10305662 | A1 | | 9/2004 |
| JP | 02-098975 | A | | 4/1990 |
| JP | 098975 | A | * | 4/1990 |
| JP | 2005-197432 | A | | 7/2005 |
| JP | 2006-032501 | A | | 2/2006 |

OTHER PUBLICATIONS

Fuji Electronic Journal vol. 78-No. 6, 2005, p. 432 (30).*
Fuji Electric Journal vol. 78-No. 6, 2005, pp. 432 (30).
European Search Report dated Feb. 7, 2013.
Johansson, J. et al.; "Modelling and Optimization of Cigs Modules"; 22nd European Photovoltaic Solar Energy Conference; Sep. 3, 2007; Milan, Italy; pp. 1922-1925.

* cited by examiner

*Primary Examiner* — Phuong Huynh
(74) *Attorney, Agent, or Firm* — Rabin & Berdo, P.C.

(57) ABSTRACT

An apparatus for estimating and evaluating characteristics of large-area series-connected solar battery cells from a measured current-voltage characteristic of a small-area single cell, includes an analysis model construction unit, an analysis operation unit and an evaluation unit. The construction unit reads shape parameters and material physical properties of the cells and automatically constructs a finite element method model. The operation unit obtains a current at a voltage based on the measured characteristic, sets the current as a current load, calculates potential distributions of transparent electrode and rear electrode of the cells, corrects the current load based on a difference between the distributions and the measured characteristic, recalculates the distributions based on the corrected current load, and repeats the recalculation until the distributions converge. The evaluation unit evaluates whether a converged calculation result is a pattern exhibiting a desired current-voltage characteristic of the cells.

11 Claims, 18 Drawing Sheets

FIG. 2A

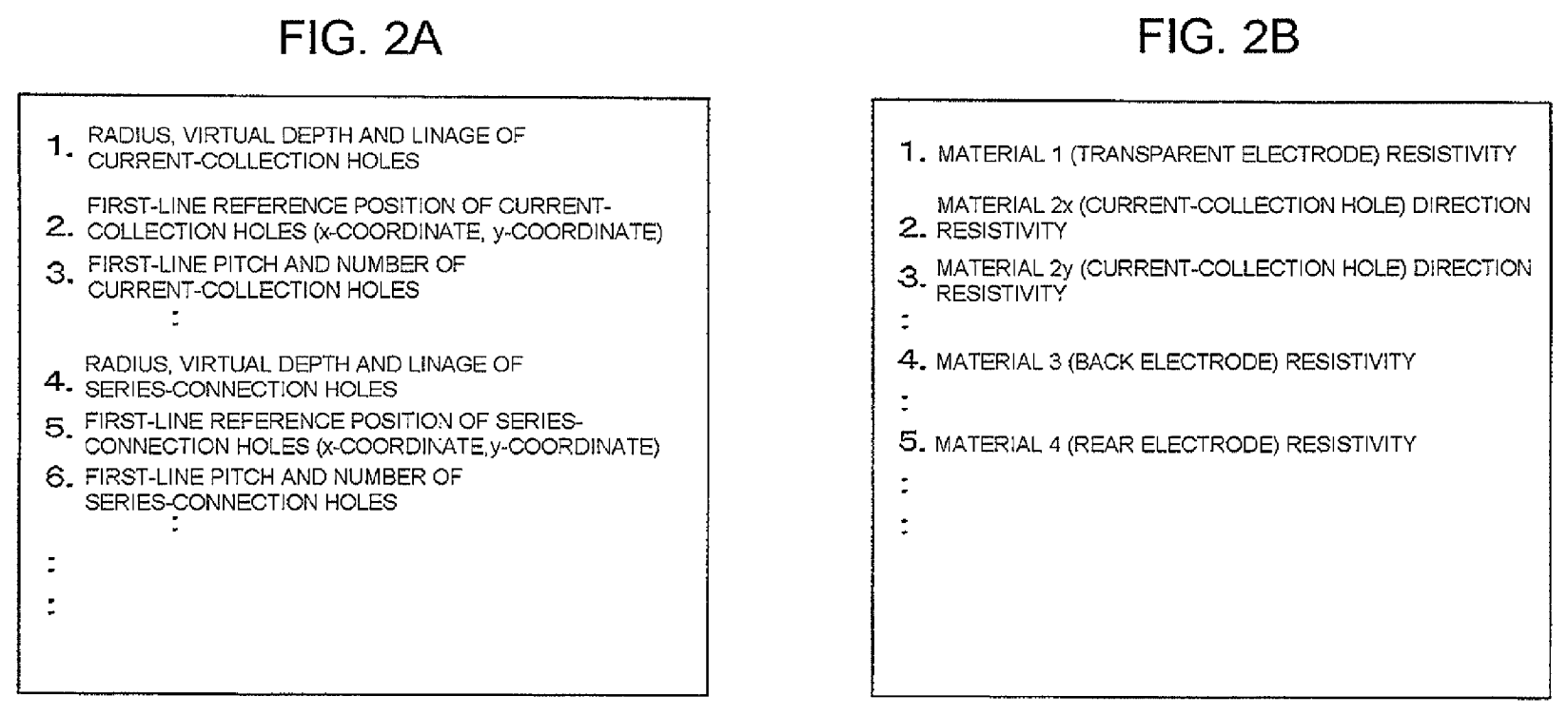

1. RADIUS, VIRTUAL DEPTH AND LINAGE OF CURRENT-COLLECTION HOLES
2. FIRST-LINE REFERENCE POSITION OF CURRENT-COLLECTION HOLES (x-COORDINATE, y-COORDINATE)
3. FIRST-LINE PITCH AND NUMBER OF CURRENT-COLLECTION HOLES

:

4. RADIUS, VIRTUAL DEPTH AND LINAGE OF SERIES-CONNECTION HOLES
5. FIRST-LINE REFERENCE POSITION OF SERIES-CONNECTION HOLES (x-COORDINATE,y-COORDINATE)
6. FIRST-LINE PITCH AND NUMBER OF SERIES-CONNECTION HOLES

1. MATERIAL 1 (TRANSPARENT ELECTRODE) RESISTIVITY
2. MATERIAL 2x (CURRENT-COLLECTION HOLE) DIRECTION RESISTIVITY
3. MATERIAL 2y (CURRENT-COLLECTION HOLE) DIRECTION RESISTIVITY

:

4. MATERIAL 3 (BACK ELECTRODE) RESISTIVITY

:

5. MATERIAL 4 (REAR ELECTRODE) RESISTIVITY

:

:

51
52
53
54
55

APPARATUS FOR ANALYSIS AND EVALUATION OF CHARACTERISTICS OF SERIES-CONNECTED SOLAR BATTERY CELLS

CROSS REFERENCE TO RELATED APPLICATIONS

This application claims the benefit of priority of Japanese application 2010-096751, filed Apr. 20, 2010 and Japanese application 2010-141910, filed Jun. 22, 2010.

BACKGROUND OF THE INVENTION

1. Field of the Invention

The present invention relates to an apparatus for analysis and evaluation of characteristics of series-connected solar battery cells. The apparatus analyzes and evaluates an analysis model of solar battery cells produced by a finite element method to thereby contribute to production of a solar battery having a series connection structure.

2. Description of the Background Art

A solar battery has a transparent electrode of indium oxide (ITO) or the like on a light incidence side, and a rear electrode of a metal on a light reflection side. The solar battery is formed so that light is guided from the transparent electrode side to a semiconductor film for photoelectric conversion, and that electric power due to photoelectric conversion is obtained from the rear electrode side (see JP-A-2-98975 (FIG. 5)). In this case, it is general that efficiency becomes lower than characteristic obtained by measurement of a small-area cell as a single test piece because of a voltage drop caused by wiring resistance of respective parts including the transparent electrode and the rear electrode. In a structure in which series connection of unit cells is performed based on a pattern formed in the same manner as in production of an electronic device such as an integrated circuit, it is therefore essential to grasp the degree of lowering of efficiency in advance to design the pattern. Particularly when there are a back electrode and through-holes for wiring in addition to the transparent electrode and the rear electrode as in an SCAF (Series Connection through Apertures formed on Film) structure shown in "Current Status and Future Trends of Amorphous Silicon Solar Cells" by Masahiro Sakurai and Toshiaki Sakai in Fuji Electric Journal Vol. 78, No. 6, 2005, pp. 29-33 (pp. 30, FIG. 2), it is important to grasp the degree of lowering of efficiency in advance before product planning because the degree of freedom in designing the pattern becomes high.

On this occasion, a simplified network model has been heretofore constructed uniquely in accordance with the pattern, and maximum electric power, fill factor (FF), etc. have been obtained by simple calculation on the network model.

In the simplified network model according to the background art, calculation is however performed based on resistors substituted for the wiring, the through-holes, etc. Accordingly, there is a problem that it is difficult to accurately calculate the influence of through-hole shape, arrangement of the through-holes, details of electrode shape, etc. on characteristic. Moreover, if shapes of the through-holes and electrodes are changed, there is a problem that it is more difficult to accurately calculate the influence on characteristic because a lot of new assumptions are placed for simplified calculation in addition to the necessity to reconstruct the network model.

On the other hand, wiring resistance automatic analysis software etc. cooperating with a mask CAD or the like to consider the pattern accurately is available on the market in the field of design of electronic devices such as integrated circuits. However, the wiring resistance automatic analysis software in the field of design of electronic devices cannot be applied to analysis of characteristic of a solar battery because modeling of a battery forming the backbone of power generation in a solar battery or generation of a current on a surface from a wiring pattern per se is not assumed.

On the other hand, if a series-connection structure shape model created by general-purpose finite element method software available on the market is used for current analysis, it is also possible to calculate a potential distribution (voltage drop) in consideration of detailed shape. However, (A) it is necessary to reconstruct the series-connection structure model whenever the pattern is changed, similarly to the aforementioned network model. Moreover, those who have no technical skill cannot use the software easily on the site of pattern designing. In addition, (B) even when a calculation result of the potential distribution (voltage drop) due to wiring resistance is obtained based on a constant current set in the electrode portion of a series-connection structure shape model constructed by use of the finite element method software, the potential distribution per se shows that the generated current is not constant (smaller than the set value), and the calculation result provides nothing more than first-order approximation.

On the contrary, it may be conceived that convergence calculation is performed by use of finite element method software. However, it is necessary to repeat calculation by tens to hundreds of times after modeling all series-connected cells arranged as a large number of cells, for example, as shown in FIG. 5A. This is not realistic in view of analysis time. It may be therefore conceived that analysis is tried on one unit cell extracted and modeled from the large number of series-connection structures arranged. In this case, it is however necessary to define a boundary condition in each cut portion. In the case of series-connected cells as shown in FIG. 5A, anyplace where wiring per se is cut is the place where a current flows. Accordingly, the measures to define the current or potential to be originally analyzed as a boundary condition are self-contradictory.

SUMMARY OF THE INVENTION

Therefore, an object of the invention is to provide an apparatus for analysis and evaluation of characteristics of series-connected solar battery cells, which can create a model of series-connected cells automatically so that analysis thereof can be dealt with accurately by a user having no technical knowledge, and that the degree of lowering of current-voltage characteristic can be estimated accurately in a practical time from potential distributions (voltage drop).

To solve the aforementioned problem, the invention provides an apparatus for analysis and evaluation of characteristics of series-connected solar battery cells for estimating characteristic of large-area series-connected cells from actually measured current-voltage characteristic of a small-area single cell, including: a data storage unit which defines shape parameters and material physical properties of current-collection holes, series-connection holes, a transparent electrode, a rear electrode, etc.; an analysis model construction unit which reads the shape parameters and material physical properties stored in the data storage unit and automatically constructs a finite element method model in consideration of electric resistance of series-connected cells; an analysis arithmetic operation unit which obtains a current at a voltage of initial calculation based on the actually measured current-voltage characteristic of the small-area single cell, sets the current as a current load, calculates potential distributions of the transparent electrode and rear electrode, re-calculates the potential distributions based on the current load corrected and set again based on a potential distribution difference between the transparent electrode and the rear electrode and the actually measured current-voltage characteristic of the small-area single cell, and repeats the re-calculation of the potential distributions until the potential distributions converge; and an evaluation unit which evaluates a calculation result converged by the analysis arithmetic operation unit as to whether the calculation result is a pattern exhibiting desired current-voltage characteristic of the large-area series-connected cells.

According to the invention, the finite element method model constructed by the analysis model construction unit has an SCAF structure, and electrodes of the finite element method model concerned with the current load set by the analysis arithmetic operation unit are a transparent electrode of a unit cell and a rear electrode of an adjacent unit cell connected in series to the transparent electrode, so that calculation for one unit cell is performed based on the current load set between the electrodes.

According to the invention, the analysis arithmetic operation unit sets virtual resistance on whole surfaces, any ranges or any points or on lines or their vicinity forming contours including holes between the transparent electrode and the rear electrode, and calculates a leakage current flowing in the virtual resistance so that the calculation of the leakage current is included in potential distribution FEM analysis.

According to the invention, a finite element method model can be constructed automatically when shape parameters are written and used. Accordingly, shape can be changed easily, and a large number of models can be created and evaluated to specify a model having a pattern exhibiting desired current-voltage characteristic for large-area series-connected cells. Moreover, even a user who is not an engineer familiar to finite element method analysis can still utilize the invention easily.

According to the invention, the degree of lowering of current-voltage characteristic in the case where series-connected cells are formed can be grasped accurately because calculation is repeated until the potential distribution is converged while the generated current is corrected based on the given current-voltage characteristic and the voltage drop obtained by analysis. In this case, analysis and evaluation can be achieved in a practical time even when finite element method analysis is introduced because calculation can be performed for one extracted unit cell.

According to the invention, the speed of development of solar battery cells can be improved greatly because evaluation to specify a pattern exhibiting desired current-voltage characteristic of large-area series-connected cells can be performed in a short time based on finite element method models.

According to the invention, not only design for the ideal case but also design nearer to the actual case can be examined because the leakage current depending on shape can be considered. Accordingly, the number of trial productions can be reduced, so that the period of time for product development can be shortened.

BRIEF DESCRIPTION OF THE DRAWINGS

FIGS. 2A and 2B are views showing an example of definition of shape data and an example of setting of material physical property data according to the invention;

DETAILED DESCRIPTION OF THE INVENTION

An embodiment of the invention will be described below in detail.

Figure 1:
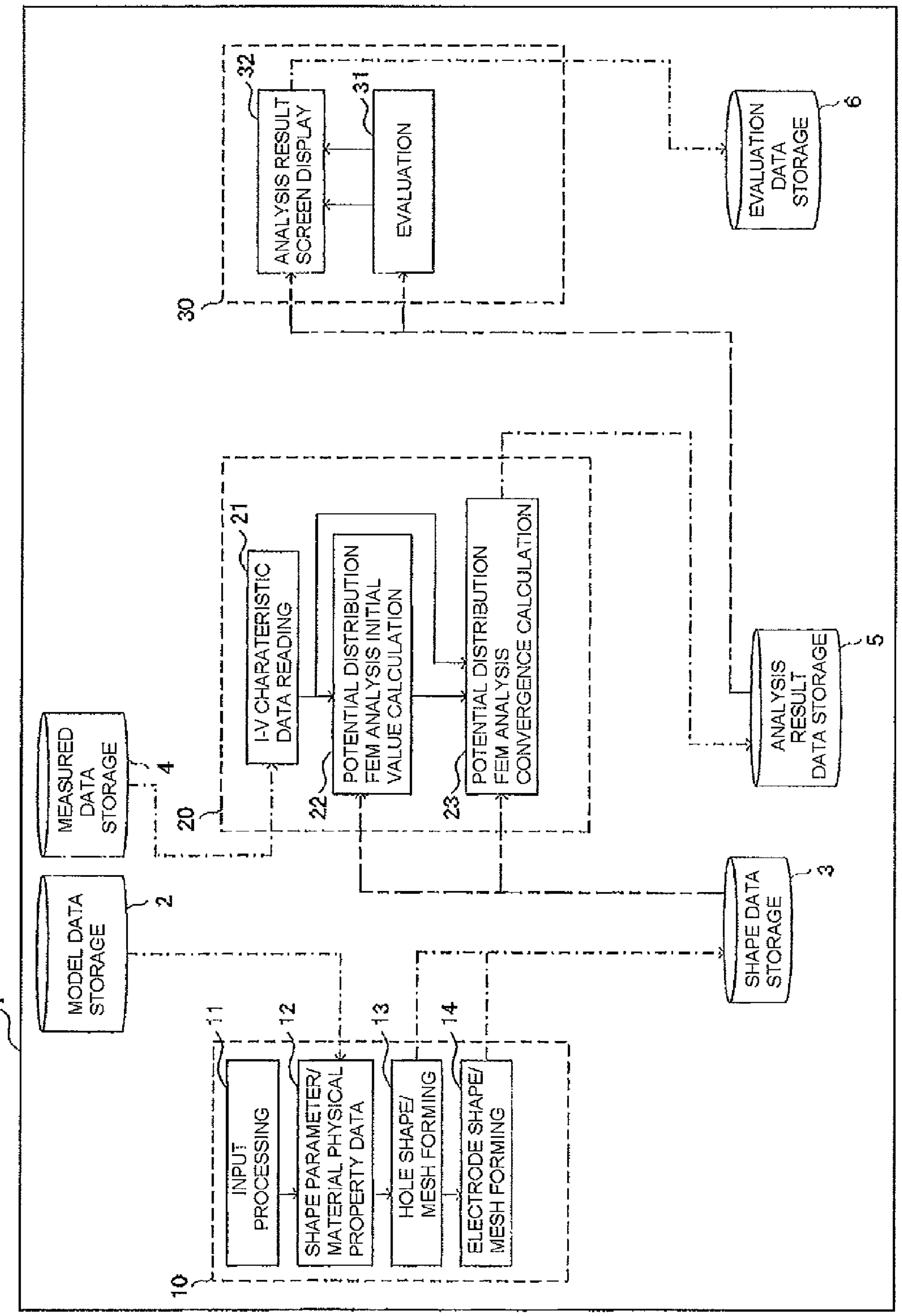
FIG. 1 is a functional block diagram showing the configuration of an apparatus for analysis and evaluation of characteristics of series-connected solar battery cells, according to an embodiment of the invention.

FIG. 1 is a functional block diagram showing the configuration of an apparatus for analysis and evaluation of characteristics of series-connected solar battery cells, according to an embodiment of the invention. Incidentally, in FIG. 1, the solid line shows a flow of processing, and the chain line shows a flow of information. As shown in FIG. 1, the apparatus according to the embodiment of the invention roughly includes: a finite element method analysis model construction device 10 which constructs a finite element method model of series-connected cells automatically; a finite element method analysis arithmetic operation device 20 which calculates a potential distribution by giving a current load to the constructed analysis model; and a finite element method analysis result evaluation device 30 which receives and evaluates an analysis result and displays the result on a screen.

The finite element method analysis model construction device 10 which automatically constructs a finite element method model basically includes a combination of a preprocessor mounted with general-purpose finite element method software or the like and a macro program for driving the preprocessor. Alternatively, the finite element method analysis model construction device 10 may be formed in such a manner that one original program for constructing a finite element method analysis model is mounted in a memory of computer hardware. Incidentally, the computer hardware has been already known by those skilled in the art. For example, the computer hardware is provided with a CPU, a memory, an input device, an output device, various kinds of interfaces, etc. so that the aforementioned program is stored in the memory, processing for constructing a model is executed by the CPU using the program stored in the memory, and a result of the processing is outputted to the memory or the output device.

That is, the finite element method analysis model construction device 10 includes an input processing portion 11, a shape parameter and material physical property data reading portion 12, a hole shape and mesh forming portion 13 concerned with current-collection holes and series-connection holes, and an electrode shape and mesh forming portion 14 concerned with a transparent electrode, a back electrode and a rear electrode. The current-collection holes and the series-connection holes, the transparent electrode, the back electrode and the rear electrode, and mesh shapes will be described later in detail with reference to FIG. 6, etc.

The input processing portion 11 executes processing for starting up this apparatus in response to a starting-up operation of a user using this apparatus. The shape parameter and material physical property data reading portion 12 reads shape parameter and material physical property data from the model data storage portion 2. The shape parameter and material physical property data are defined in advance for constructing a finite element method model and stored in a model data storage portion 2. FIG. 2A shows an example of definition of shape data related to the invention and stored in the model data storage portion 2. Radii, virtual depths, linage, reference positions and pitches in the first lines, numbers of holes, etc. concerned with current-collection holes and series-connection holes are defined as shown in FIG. 2A. FIG. 2B shows an example of setting of material physical property data related to the invention and stored in the model data storage portion 2. Resistivities concerned with physical properties of the transparent electrode, the back electrode and the rear electrode, x-direction and y-direction resistivities in current-collection holes, etc. are set and defined as shown in FIG. 2B.

The hole shape and mesh forming portion 13 and the electrode shape and mesh forming portion 14 automatically create hole shapes, mesh shapes etc., for example, necessary for an SCAF structure (which will be described in detail later) to thereby form a finite element method analysis model. This will be described later. The finite element method analysis model formed thus is stored in a shape data storage portion 3.

The finite element method analysis arithmetic operation device 20 basically includes a combination of a solver mounted with general-purpose finite element method software etc. and a micro program for driving the solver, similarly to the finite element method analysis model construction device 10. Alternatively, the finite element method analysis arithmetic operation device 20 may be formed in such a manner that one original program for executing a finite element method analysis arithmetic operation is mounted in a memory of computer hardware. Incidentally, the computer hardware has been already known by those skilled in the art. For example, the computer hardware is provided with a CPU, a memory, an input device, an output device, various kinds of interfaces, etc. so that the aforementioned program is stored in the memory, processing for constructing a model is executed by the CPU using the program stored in the memory, and a result of the processing is outputted to the memory or the output device.

That is, the finite element method analysis arithmetic operation device 20 includes an I-V characteristic (current-voltage characteristic) data reading portion 21, a potential distribution FEM analysis initial value calculation portion 22, and a potential distribution FEM analysis convergence calculation portion 23. Incidentally, FEM is an abbreviation for Finite Element Model which means a finite element method model.

The I-V characteristic data reading portion 21 reads I-V characteristic data of a small-area cell actually measured in advance and stored in a measured data storage portion 4. The potential distribution FEM analysis initial value calculation portion 22 calculates current density J in the transparent electrode and the rear electrode at a voltage V given to the battery from the I-V characteristic data of the small-area cell read by the I-V characteristic data reading portion 21 for the shape data of the analysis model stored in the shape data storage portion 3 while regarding the potential difference (voltage drop) $\Delta Vn$ (in which $\underline{n}$ is a specific node point) between the transparent electrode and the rear electrode as being zero, that is, regarding the voltage drop due to electrode wiring as being zero, sets current In in accordance with each node point $\underline{n}$ based on area data Sn allotted to the node point to obtain uniform current density J based on the calculated current density, and gives the current In as a current load to thereby calculate a potential distribution at an initial value. For potential distribution FEM analysis, all shape data of the analysis model stored in the shape data storage portion 3 are considered. This will be described later. Incidentally, the term "node point" means a point defined for representing a value of each element when a region to be analyzed by FEM (finite element method) is divided into elements.

The potential distribution FEM analysis convergence calculation portion 23 acquires the potential difference $\Delta Vn$ (in which $\underline{n}$ is a specific node point) between the transparent electrode and the rear electrode in node point number data of the transparent electrode and the rear electrode from the shape data of the analysis model, calculates current density Jn in the transparent electrode and the rear electrode at a voltage $V+\Delta Vn$ by using the I-V characteristic data of the small-area cell read by the I-V characteristic data reading portion 21, and sets current In in accordance with each node point $\underline{n}$ based on area data Sn allotted to the node point to obtain current density Jn to thereby re-calculate a potential distribution. For potential distribution FEM analysis, all shape data of the analysis model stored in the shape data storage portion 3 are considered. Whether the re-calculated potential distribution varies or not is checked. Calculation is repeated until the potential distribution does not vary. When the potential distribution does not vary, the potential distribution FEM analysis is terminated. An analysis result at this time point is stored in an analysis result data storage portion 5. This will be described later. Alternatively, the aforementioned convergence calculation may be repeated until the total current does not vary.

The finite element method analysis result evaluation device 30 evaluates the result of analysis performed by the finite element method analysis arithmetic operation device 20 and displays the evaluated result on a screen. That is, the finite element method analysis result evaluation device 30 includes an evaluation portion 31, and an analysis result screen display portion 32.

The evaluation portion 31 receives analysis result data of the finite element method analysis arithmetic operation device 20 stored in the analysis result data storage portion 5, and evaluates the analysis result data. For evaluation, the evaluation portion 31 receives and evaluates the analysis result data stored in the analysis result data storage portion 5 while seeing the analysis result screen display portion 32 which displays the analysis result data on a screen. Finite element method models (patterns) different in shape are created by the finite element method analysis model construction device 10. The finite element method analysis models changed in shape are analyzed in a practical analysis time by the finite element method analysis arithmetic operation device 20. Which pattern among the large number of thus obtained models exhibiting desired current-voltage characteristic as large-area series-connected cells is evaluated. Incidentally, for final evaluation, it is necessary to verify whether a solar battery can be practically produced based on the pattern evaluated by the evaluation portion 31 and to confirm whether actually measured characteristic of the practically produced solar cells is as expected.

Although description has been made in the case where the finite element method analysis model construction device 10, the finite element method analysis arithmetic operation device 20 and the finite element method analysis result evaluation device 30 shown in FIG. 1 are constituents independent of one another, these devices are practically achieved on one computer. Although description has been made in the case where the model data storage portion 2, the shape data storage portion 3, the measured data storage portion 4, the analysis result data storage portion 5 and an evaluation data storage portion 6 are constituents independent of one another, these portions may be practically formed on one memory which is one computer hardware resource.

Figure 3:
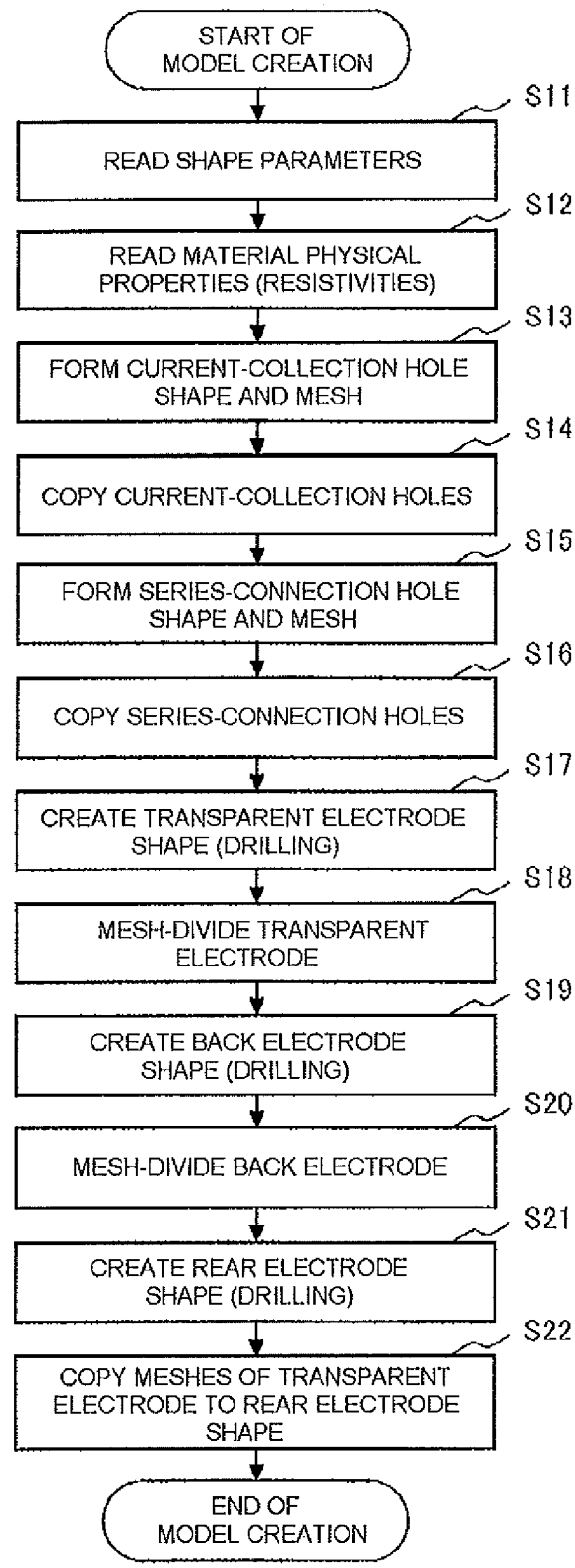
FIG. 3 is a flowchart showing a model creation procedure executed by the finite element method analysis model construction device shown in FIG. 1.

A model creation procedure performed by the finite element method analysis model construction device 10 for constructing a finite element method model automatically will be described next with reference to FIG. 3 while an SCAF structure cell is taken as an example. In FIG. 3, step is abbreviated to "S". At start of the model creation procedure, shape parameters are first read from the model data storage portion 2 (step S11). Then, material physical property data such as the aforementioned resistivities are also read from the model data storage portion 2 (step S12). Then, current-collection hole shape and mesh of a model in which the shape parameters are defined are formed (step S13). Because mesh forming is a method generally performed in analysis using general-purpose finite element method software, description thereof will be omitted. The same rule applies to the following steps. Then, a required number of current-collection holes are copied in accordance with the number of current-collection holes of the model in which the shape parameters are defined (step S14).

Similarly, series-connection hole shape and mesh are formed (step S15) and a required number of series-connection holes are copied in accordance with the number of series-connection holes in the model where the shape parameters are defined (step S16).

Then, transparent electrode shape is created (drilling position is set) (step S17). The transparent electrode is mesh-divided in accordance with the created shape (step S18). On this occasion, the allotted area of the node point n on the transparent electrode is expressed by Sn (see FIG. 5B). Similarly, back electrode shape is created (drilling position is set) (step S19). The back electrode is mesh-divided in accordance with the created shape (step S20). Finally, rear electrode shape is created (drilling position is set) (step S21). The meshes of the transparent electrode are copied to the created rear electrode shape (step S22). On this occasion, the allotted area of the node point n' on the rear electrode is in a position opposite to the node point n on the transparent electrode as Sn' to establish Sn'=Sn. After the aforementioned steps, the process of automatically creating a finite element method model is terminated.

When the model creation procedure as shown in FIG. 3 is incorporated in the finite element method analysis model construction device 10 in advance, a model can be constructed automatically as described above.

Figure 5A:
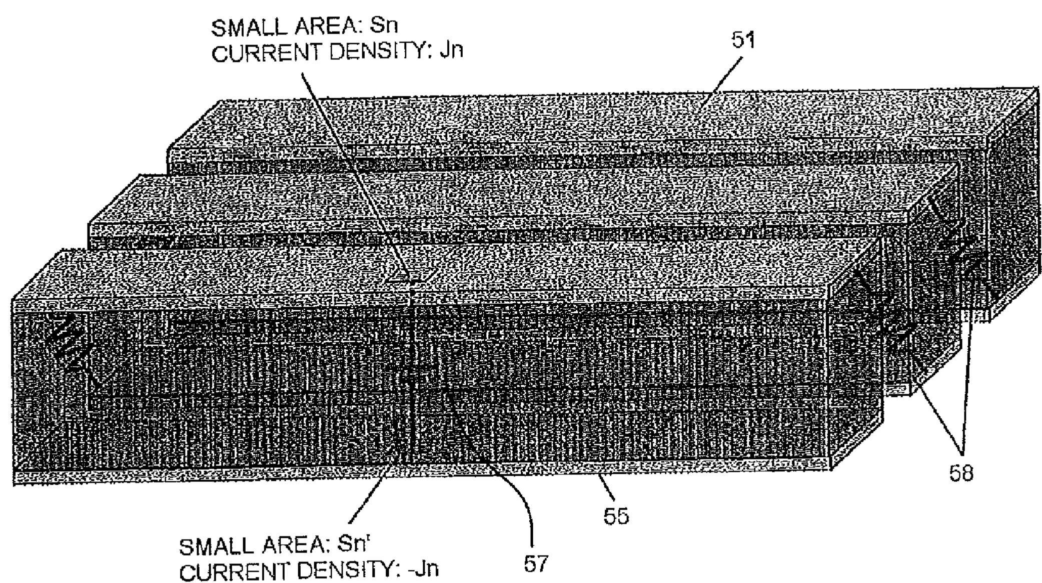
FIGS. 5A and 5B are views for explaining the concept (part 1) of a finite element method model of series-connected cells according to the invention.
Figure 5B:
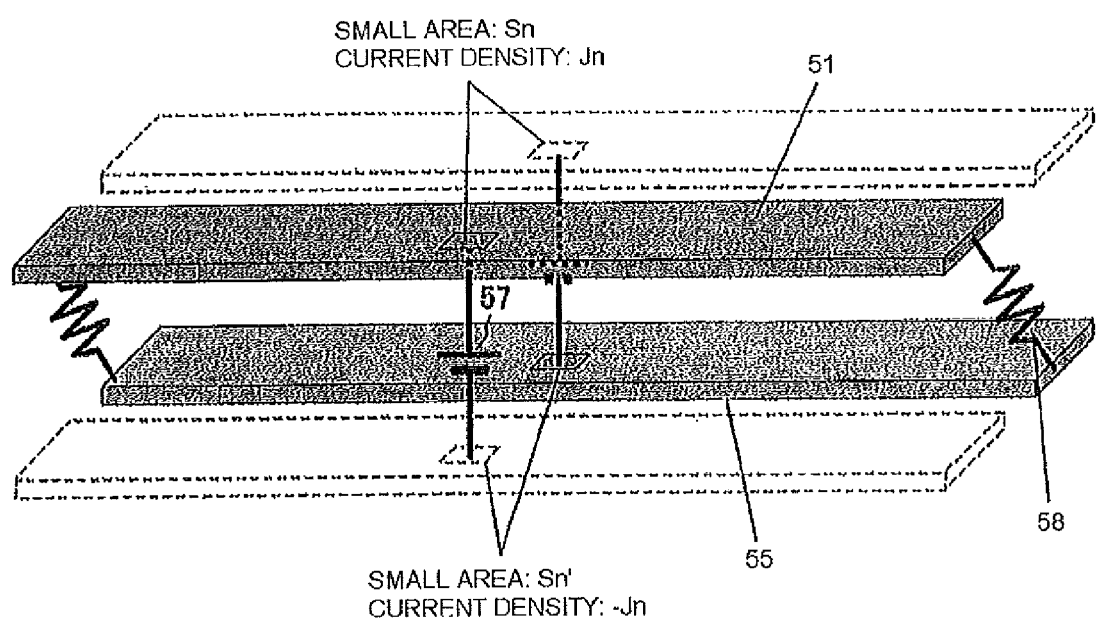

In the case where the model creation procedure as shown in FIG. 3 is incorporated to create a finite element method model automatically, extraction of a cell (unit cell) as an analysis unit in this embodiment is performed not by a conventional method shown in FIG. 5A but by a method shown in FIG. 5B. That is, if a series-connection structure is assumed to continue infinitely, respective potential distributions of the transparent electrode and the rear electrode in one unit cell are made equal to each other in all unit cells. In this manner, the potential difference between opposite ends of a battery can be obtained without modeling of the rear electrode just under the transparent electrode as shown in FIG. 5A. That is, one unit cell as shown in FIG. 5B can be extracted and subjected to FEM analysis without forcedly setting a boundary condition in a cut portion as in the background art. It is however necessary to set fixed potential at any point because it is impossible to determine absolute potential at one point in series connection assumed to continue infinitely. Incidentally, it is desirable that meshes of the transparent electrode are set to be equal to meshes of the rear electrode in order to simplify calculation.

Figure 4:
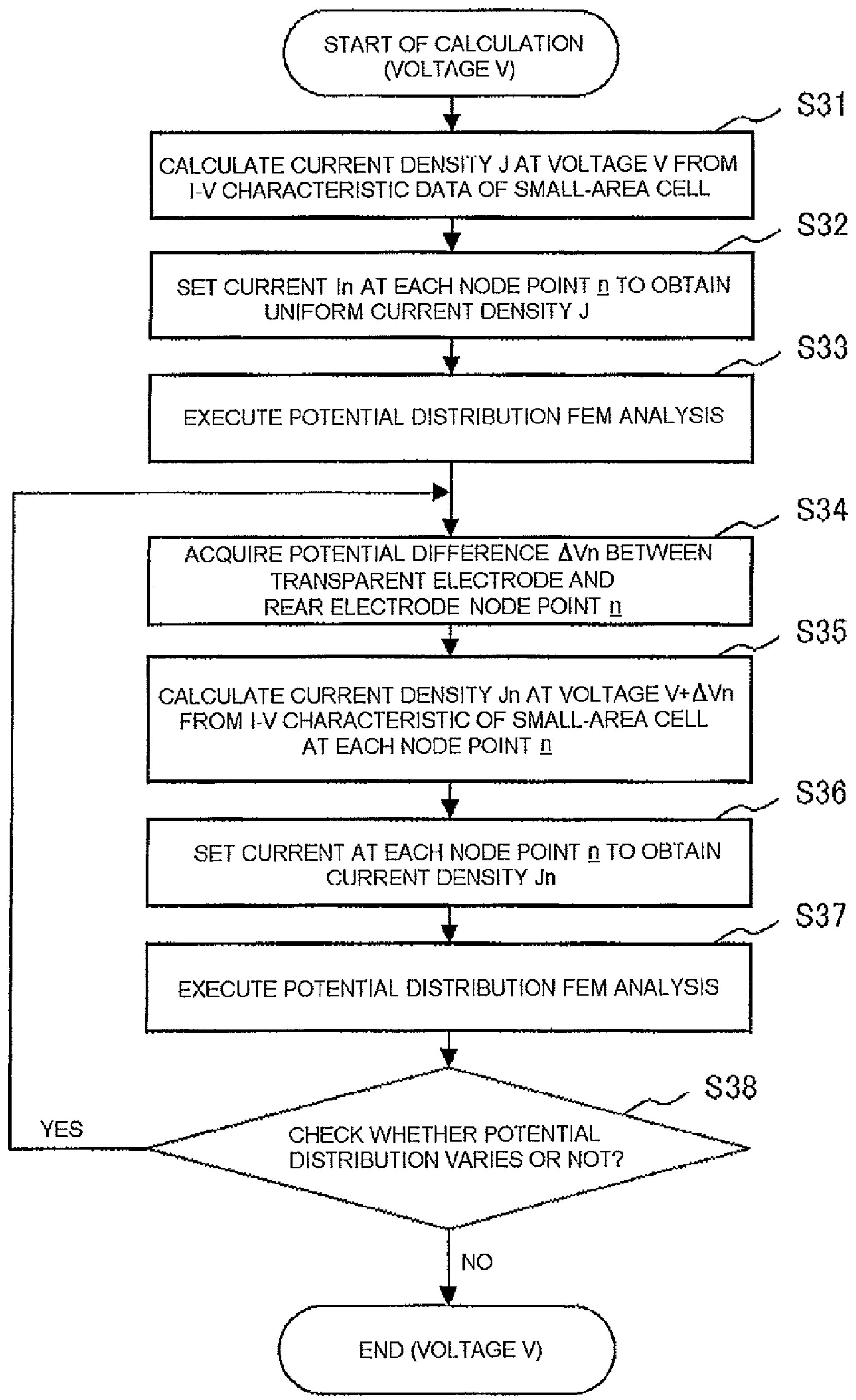
FIG. 4 is a flow chart showing a potential distribution analysis procedure (part 1) executed by the finite element method analysis arithmetic operation device shown in FIG. 1.

A potential distribution analysis procedure (part 1) of the finite element method analysis arithmetic operation device 20 which calculates a potential distribution repeatedly while giving a current load will be described next with reference to FIG. 4. In FIG. 4, step is abbreviated to "S". At start of the potential distribution analysis procedure, current density J (=f(V)) on each of the transparent electrode and the rear electrode at a voltage V given to the battery is calculated from I-V characteristic data of a small-area cell read by the I-V characteristic data reading portion 21 for shape data of an analysis model stored in the shape data storage portion 3 while regarding the potential difference (voltage drop) ΔVn (in which n is a specific node point) between the transparent electrode and the rear electrode as being zero, that is, regarding the voltage drop due to electrode wiring as being zero (step S31). Then, current In (In=J*Sn or In'=−J*Sn) is set in accordance with each node point n based on area data Sn allotted to the node point to obtain uniform current density J (step S32). Then, potential distribution FEM analysis of all shape data stored in the shape data storage portion 3 is executed (step S33). For potential distribution analysis, a current generated from the battery is given as a load to the transparent electrode and the rear electrode in the finite element method model. On the assumption that each battery is independent in accordance with each small area Sn (there is no current flowing in an adjacent small battery in the inside of the battery), the current distribution of the transparent electrode and the current distribution of the rear electrode can be set to be equal to each other (but different in sign) because the current flowing into a battery and the current flowing out of the battery are equal to each other in accordance with each small area Sn.

In next step S34, the potential difference ΔVn between the transparent electrode and the rear electrode in accordance with each node point n is acquired. Then, current density Jn (=f(V+ΔVn)) at a voltage V+ΔVn in accordance with each node point n is calculated from the I-V characteristic of the small-area cell (step S35). Then, current In (In=Jn*Sn or In'=−Jn*Sn) is set in accordance with each node point n based on area data Sn allotted to the node point to obtain the current density Jn (step S36). Then, potential distribution FEM analysis of all shape data stored in the shape data storage portion 3 is executed (step S37). In next step S38, whether the potential distribution varies or not, is checked after the potential distribution FEM analysis in the step S37 is performed.

Figure 12:
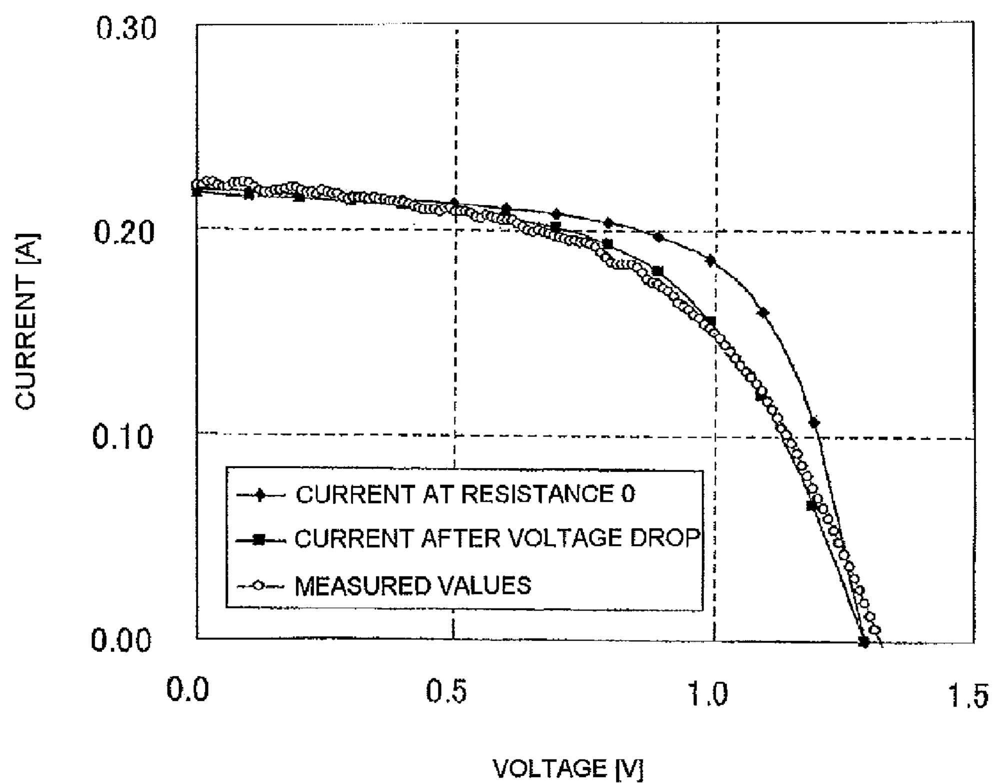
FIG. 12 is a graph showing an example of comparison between the actually measured values of current-voltage characteristic of a practically used SCAF structure cell and current-voltage characteristic of an SCAF structure cell evaluated by the finite element method analysis result evaluation device shown in FIG. 1.

When the potential distribution varies, processing goes back to the step S34 so that the steps S34 to S37 are repeated until the potential distribution does not vary. On the other hand, when the potential distribution does not vary, a series of calculations on the I-V characteristic of the small-area cell at the voltage Vis terminated. Though not shown, a series of processing shown in FIG. 4 is further continued while the position of the voltage V on the I-V characteristic of the small-area cell is changed, that is, while the voltage V is changed. In this manner, the finite element method analysis arithmetic operation device 20 analyzes current-voltage characteristic of series-connected cells by repeating the series of processing shown in FIG. 4 based on loop calculation while changing the voltage V. An example of the analysis result is represented by a solid-line curve traced by points plotted with black squares in FIG. 12. Incidentally, a solid-line curve traced by points plotted with black rhombi in FIG. 12 represents current-voltage characteristic at the aforementioned initial value (the potential difference ΔVn between the transparent electrode and the rear electrode is zero). Incidentally, maximum electric power, fill factor (FF), efficiency, etc. can be calculated suitably when the current-voltage characteristic is obtained.

In the above description, processing shown in FIG. 4 is for explaining that convergence is determined when the potential distributions do not vary. Alternatively, convergence may be determined based on current distributions, potential or current at a specific position, etc.

FIGS. 5A and 5B are views (part 1) for explaining the concept of a finite element method model of series-connected cells according to the invention. FIG. 5A shows a schematic view of a series-connection structure model in which unit cells having a large number of batteries 57 each generated by photoelectric operation between a small area Sn on the transparent electrode 51 and a small area Sn' on the rear electrode 55 are connected in series by series-connection wiring 58. Although three unit cells are shown in the schematic view of FIG. 5A, tens of unit cells are arranged practically. Because an enormous time is required for performing analysis while modeling all the unit cells and repeating calculation by tens to hundreds of times, it cannot be said that this is a realistic method.

On the other hand, FIG. 5B shows a schematic view of a state where a region from the transparent electrode 51 of a unit cell to the rear electrode 55 of an adjacent unit cell is extracted as one unit cell of an analysis model on the assumption that series connection continues infinitely on a model to be subjected to finite element method analysis in the schematic view of the series-connection structure model shown in FIG. 5A, so that one unit cell's calculation is performed based on the unit cell. Incidentally, in FIGS. 5A and 5B, it is conceived that this region contributes to electromotive force (battery 57) on the assumption that the small area on the transparent electrode (positive electrode side) 51 and the current density thereof are Sn and Jn, and likewise, the small area on the rear electrode (negative electrode side) 55 and the current density thereof are Sn' and −Jn.

Figure 6:
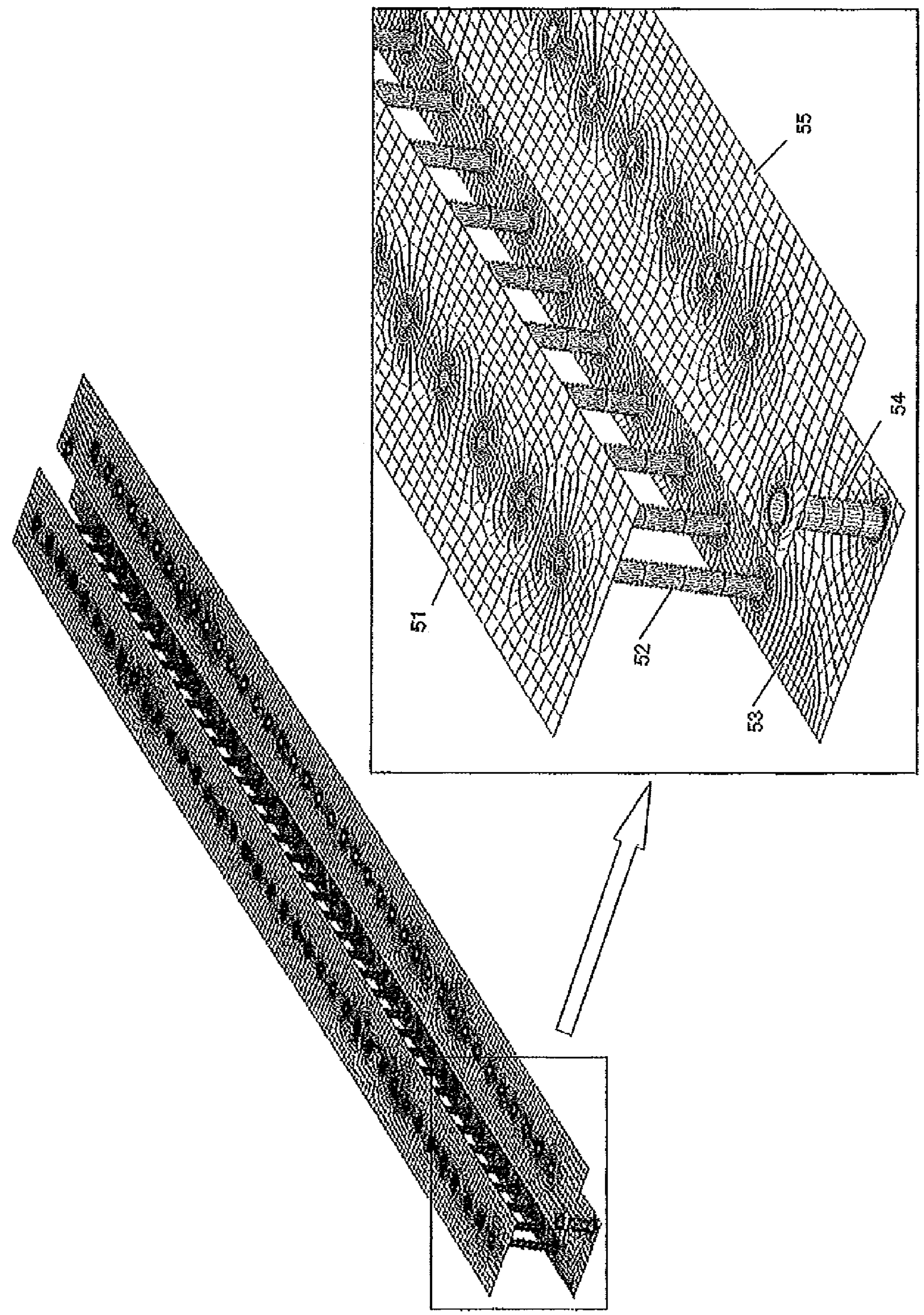
FIG. 6 is a view showing an example (part 1) of a finite element method model constructed by the finite element method analysis model construction device shown in FIG. 1.

FIG. 6 is a view showing an example (part 1) of a finite element method model constructed by the finite element method analysis model construction device 10 shown in FIG. 1. Aright part of FIG. 6 is an enlarged view showing a part of a one-unit cell model shown in a left part of FIG. 6. Series connection of the transparent electrode 51 and the adjacent rear electrode 55 is configured so that the transparent electrode 51 is connected to the back electrode 53 through current-collection holes 52, and the back electrode 53 is further connected to the adjacent rear electrode 55 through series-connection holes 54. Incidentally, the example (part 1) of the finite element method model shows an example in the case where one column of current-collection holes (apertures) are defined based on a definition example of shape data shown in FIG. 2A. More specifically, for example, 38 holes with a hole diameter of 1 mm are arranged in the center of the transparent electrode with an electrode size of about 12 mm×200 mm. Incidentally, the electrode size of the rear electrode, the positions of arrangement of holes in the rear electrode and the number of the holes are set to be equal to those in the transparent electrode.

Figure 7:
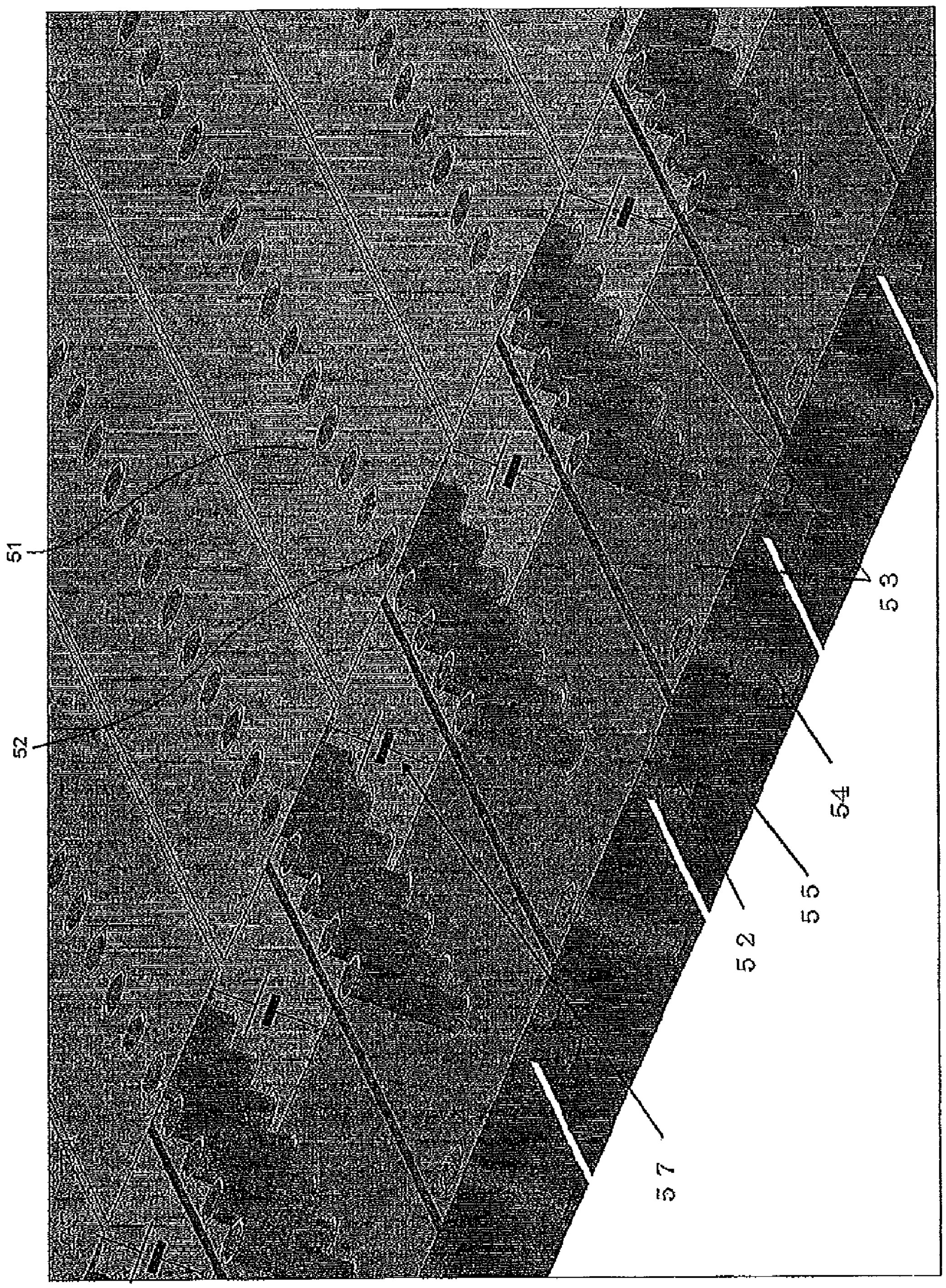
FIG. 7 is a view showing a detailed structure of a series-connection structure (SCAF structure) according to the invention.

FIG. 7 is a view showing a detailed structure in which a large number of series-connection structures (SCAF structures) according to the invention are arranged practically in a similar manner. In FIG. 7, a part of the transparent electrode 51 on the series-connection hole (aperture) 54 side has been removed so that the inside thereof can be seen through. Each battery model 57 is on the whole surfaces of the transparent electrode 51 and the rear electrode 55. The battery models 57 are independent of one another in accordance with small areas Sn (see FIGS. 5A and 5B). The transparent electrode 51 and the back electrode 53 are connected to each other through the current-collection holes 52.

The SCAF structure will be described again. The SCAF structure is the mnemonic name of series-connected solar battery cells developed by the present Applicant as shown in "Current Status and Future Trends of Amorphous Silicon Solar Cells" by Masahiro Sakurai and Toshiaki Sakai in Fuji Electric Journal Vol. 78, No. 6, 2005, pp. 29-33 (pp. 30, FIG. 2). In the SCAF structure, holes for connecting adjacent batteries in series, that is, series-connection holes are formed in end portions of a module so that the back electrode and the rear electrode formed on opposite surfaces of a plastic film substrate can be connected in series through the holes (apertures). Incidentally, the transparent electrode and the back electrode are connected to each other by current-collection holes.

Figure 8:
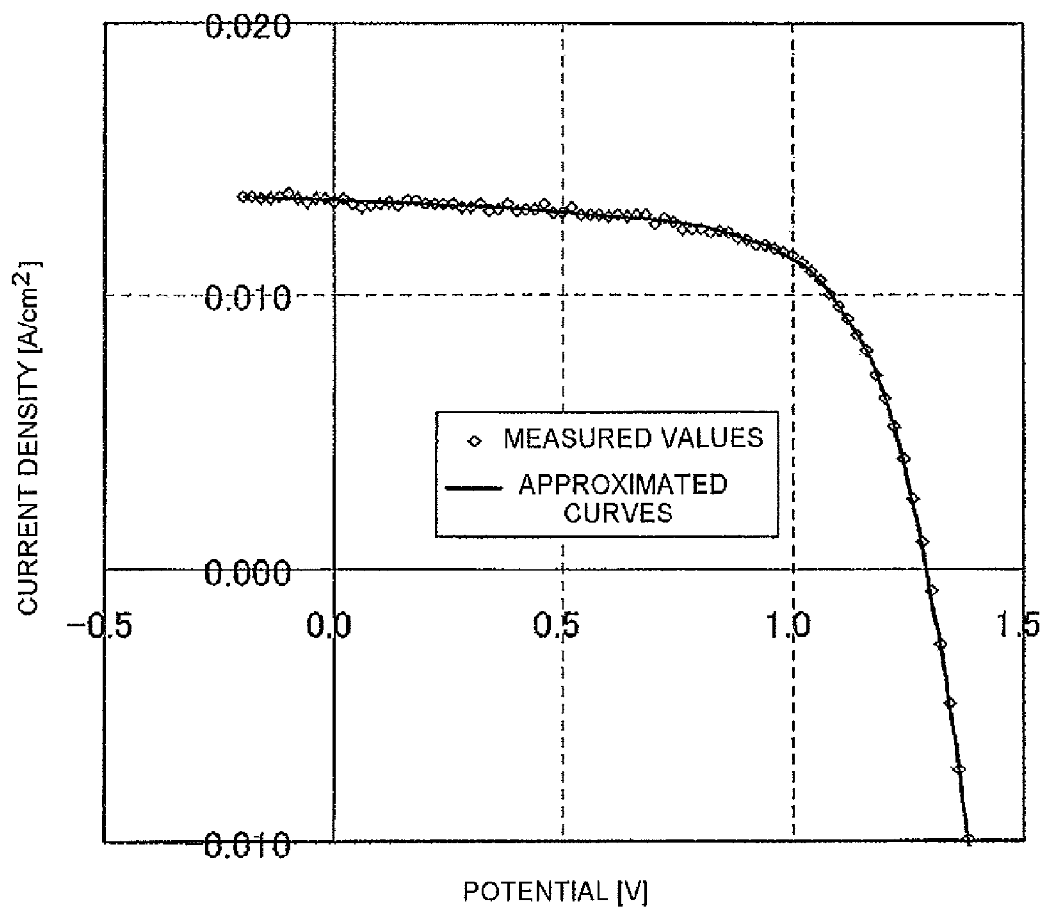
FIG. 8 is a graph showing an example of input data obtained from actually measured values of a small-area cell used in potential distribution analysis executed by the finite element method analysis arithmetic operation device shown in FIG. 1.

FIG. 8 is a graph showing an example of input data obtained from actually measured values of a small-area cell used in potential distribution analysis executed by the finite element method analysis arithmetic operation device 20 shown in FIG. 1. FIG. 8 shows current-voltage characteristic data, that is, actually measured I-V characteristic data obtained in such a manner that a small area (see FIGS. 5A and 5B) of a solar battery sample (not shown) produced in advance is irradiated with sunbeams. This data are used as input data for potential distribution analysis. This actually measured data are stored in the actually measured data storage portion 4 shown in FIG. 1 so that the data can be used as input data for potential distribution analysis. Incidentally, with respect to the input data used for potential distribution analysis, values at actual measurement points (data) per se are not used but data on an approximated curve obtained by tracing actually measured values are used.

Figure 9:
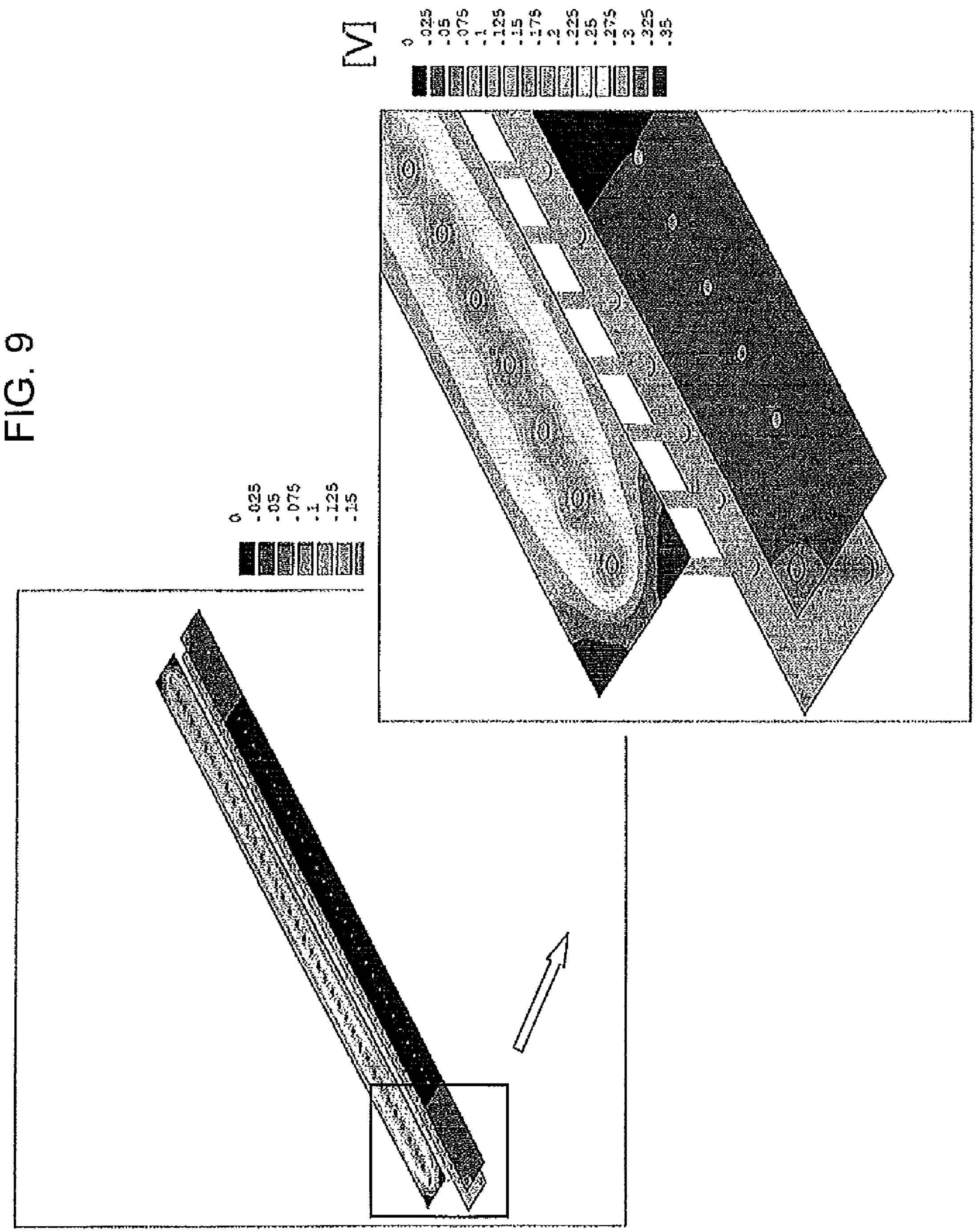
FIG. 9 is a view showing a state (contour display) of a not-converged potential distribution obtained by the finite element method analysis arithmetic operation device shown in FIG. 1.

FIG. 9 is a view showing a state (contour display) of a not-converged potential distribution obtained by the finite element method analysis arithmetic operation device 20 shown in FIG. 1. In the case where potential distribution analysis is performed by the finite element method analysis arithmetic operation device 20 according to the invention shown in FIG. 1, a potential distribution as shown in FIG. 9 is exhibited when a calculation result by the potential distribution FEM analysis initial value calculation portion 22 is contour-displayed because the analysis result has not converged yet by calculation executed by the potential distribution FEM analysis initial value calculation portion 22. As is obvious from FIG. 9, there can be seen a state in which the potential difference at a position of the transparent electrode 51 (a left end of the transparent electrode 51) far from the current-collection holes 52 is large (displayed as near black). Incidentally, the term "contour" means a line (contour line) connecting equal numerical values on a plane as widely known by those skilled in the art.

Figure 10:
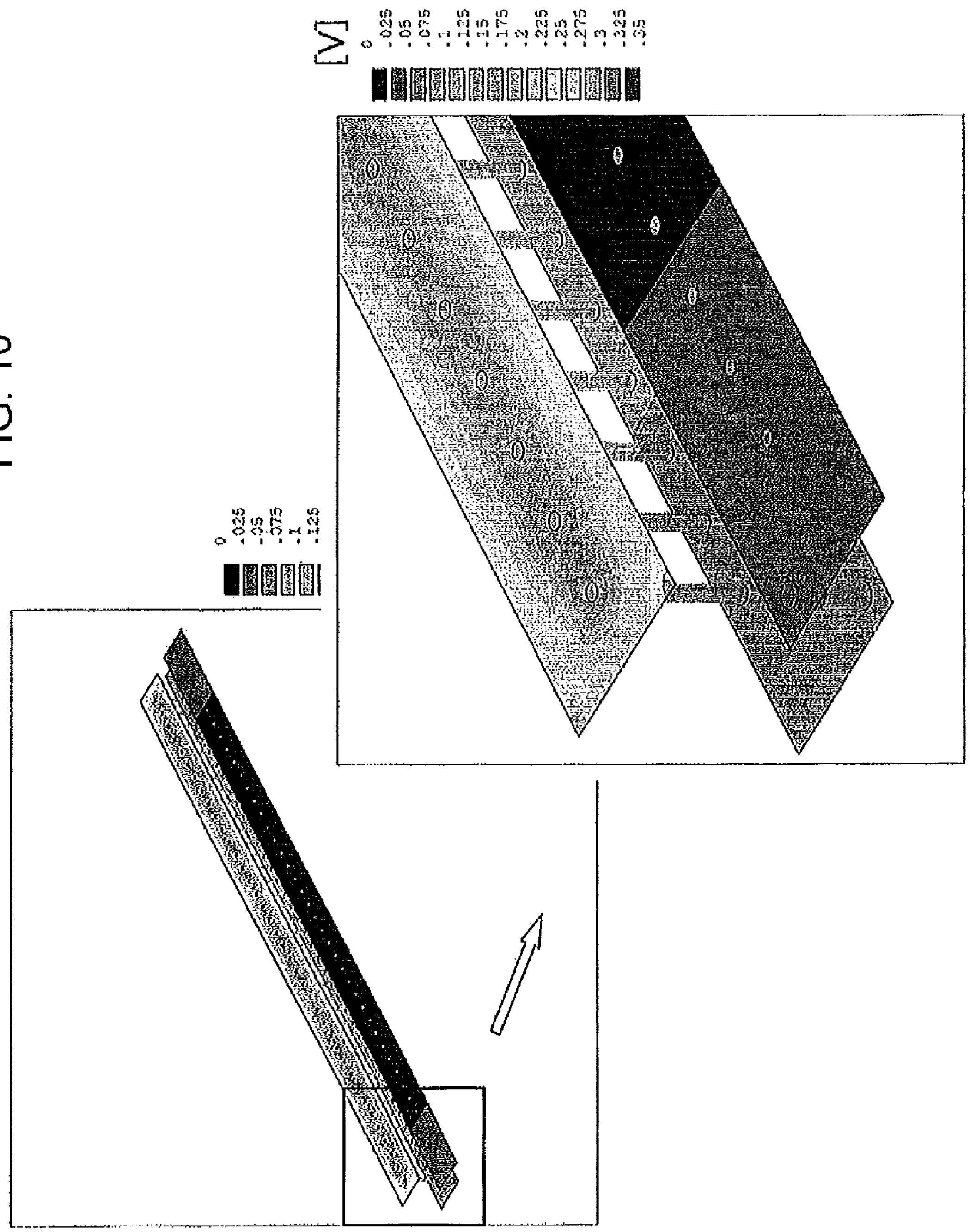
FIG. 10 is a view showing a state (contour display) of a converged potential distribution obtained by the finite element method analysis arithmetic operation device shown in FIG. 1.

FIG. 10 shows a state (contour display) of a converged potential distribution obtained by the finite element method analysis arithmetic operation device 20 shown in FIG. 1. Although the state (contour display) of the not-converged potential distribution is shown in FIG. 9, the state (contour display) of the converged potential distribution is shown in FIG. 10. When potential distribution analysis is performed by the finite element method analysis arithmetic operation device 20 according to the invention shown in FIG. 1, an analysis result due to calculation by the potential distribution FEM analysis convergence calculation portion 23 converges. Accordingly, when this state is illustrated, the state (contour display) of the converged potential distribution is obtained as shown in FIG. 10. As is obvious from FIG. 10, it can be understood that there is no change in the fact that the potential difference at a position of the transparent electrode 51 (a left end of the transparent electrode 51) far from the current-collection holes 52 is large, but the potential difference is reduced by convergence calculation. (Because a power generation current is lowered in the place where the potential difference is large, the potential difference per se is reduced.)

Figure 11:
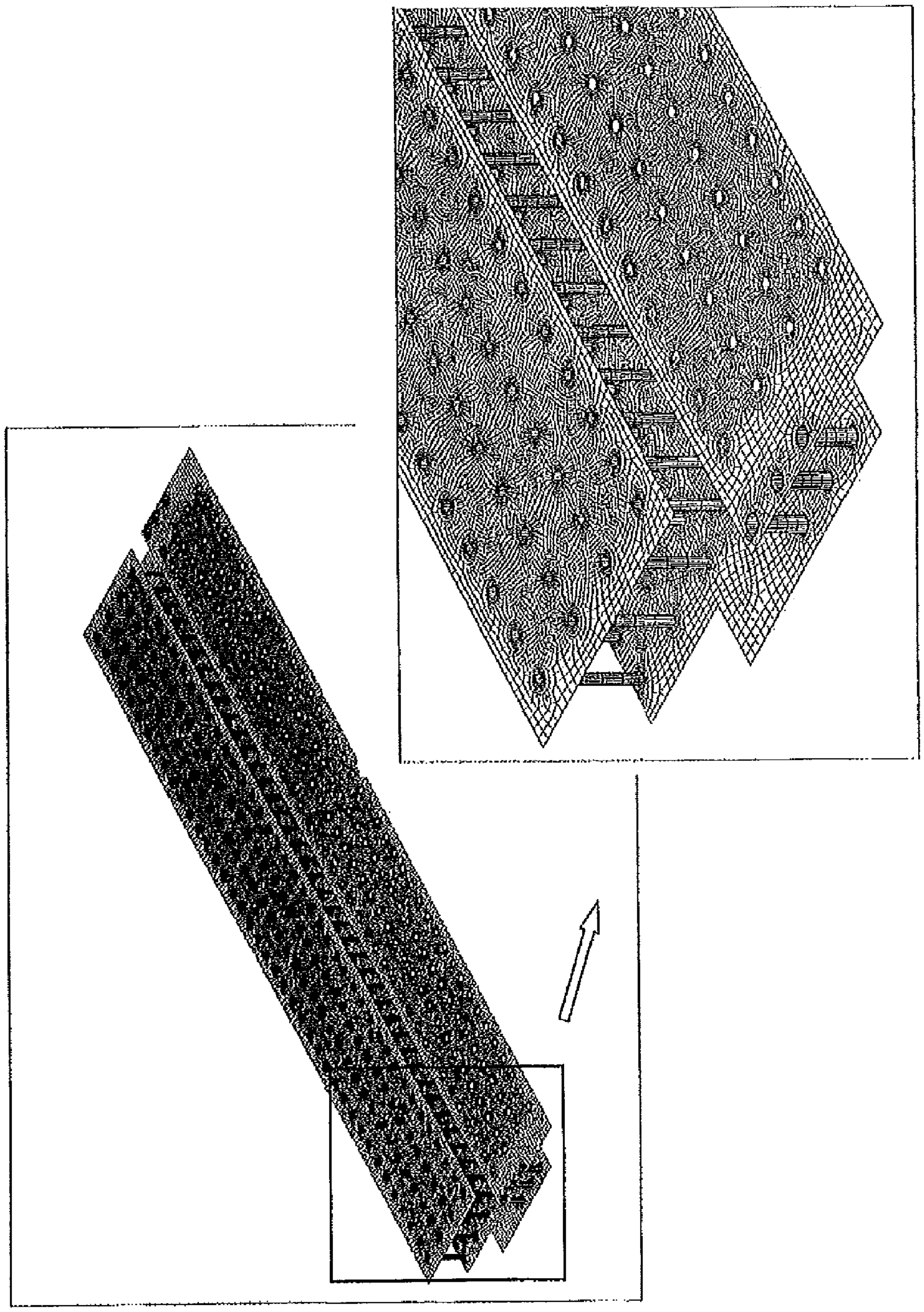
FIG. 11 is a view showing an example (part 2) of a finite element method model constructed by the finite element method analysis model construction device shown in FIG. 1.

FIG. 11 is a view showing an example (part 2) of a finite element method model constructed by the finite element method analysis model construction device 10 shown in FIG. 1. The example (part 2) of the finite element method model shown in FIG. 11 shows an example in which shape data of an SCAF structure in which four columns of holes (current-collection holes) provided in an electrode with a larger-area electrode size than that in the example (part 1) of the finite element method model shown in FIG. 6 are defined so that a finite element method model is constructed automatically. Incidentally, the reason why such a finite element method model is constructed for analysis is that it is necessary to meet a request on the side of a user using solar battery cells, such as a request to obtain large-current solar battery cells. In this case, the number of series-connection holes increases inevitably because of the necessity to obtain a large current. In this example, three series-connection holes are provided. In this manner, the finite element method analysis model construction device 10 in the invention can construct a finite element method model automatically in a range of from the example (part 1) of the finite element method model as shown in FIG. 6 to the example (part 2) of the finite element method model as shown in FIG. 11 by a simple operation of setting shape data for producing solar battery cells to meet the user's request etc.

FIG. 12 is a graph showing an example of comparison between current-voltage characteristic of an SCAF structure cell evaluated by the finite element method analysis result evaluation device 30 shown in FIG. 1 and actually measured value of current-voltage characteristic of an SCAF structure cell practically used. The example shown in FIG. 12 is in the case where two columns of current-collection holes (apertures) are provided in a predetermined electrode size, and the finite element method model has an SCAF structure. The finite element method model of the aforementioned shape constructed by the finite element method analysis model construction device 10 shown in FIG. 1 is subjected to potential distribution FEM analysis calculation up to convergence by the finite element method analysis arithmetic operation device 20 shown in FIG. 1, and evaluated by the finite element method analysis result evaluation device 30 shown in FIG. 1. The evaluation result is displayed as current-voltage characteristic (represented by the solid line in FIG. 12) on a screen while the actually measured values of current-voltage characteristic of the SCAF structure cell produced practically based on the same shape data as described above is superposed on the evaluation result. In this manner, it is confirmed that the value of current-voltage characteristic analyzed and evaluated by the apparatus 1 for analysis and evaluation of characteristics of series-connected solar battery cells according to the embodiment of the invention does not misfit the actually measured values of current-voltage characteristic of the SCAF structure cell produced practically.

Figure 13A:
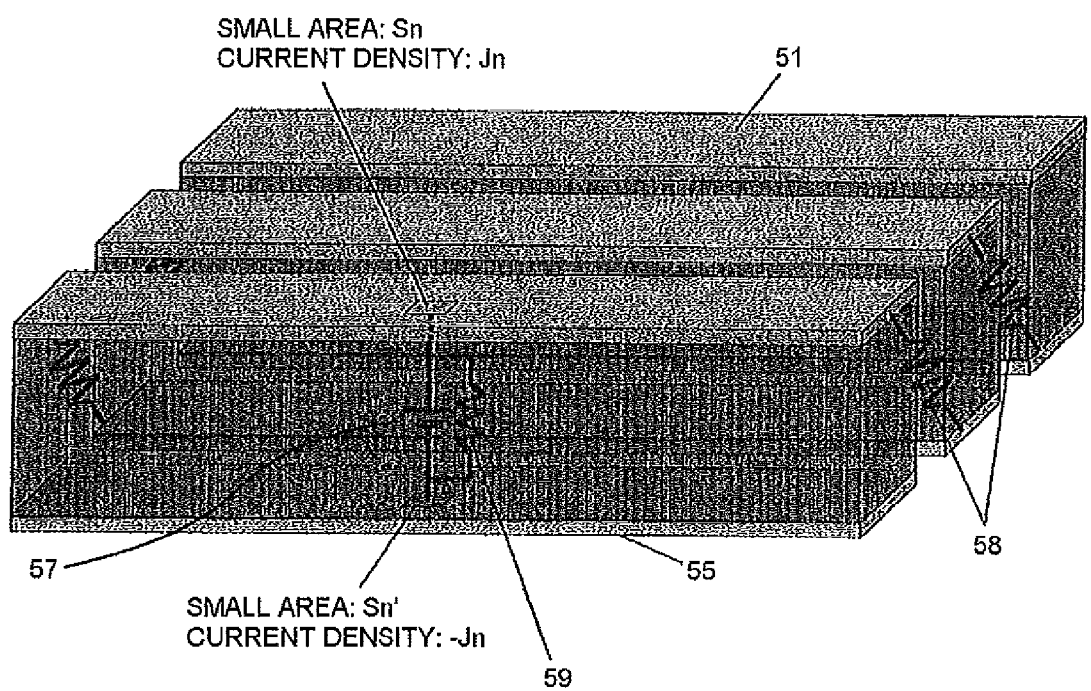
FIGS. 13A and 13B are views for explaining the concept (part 2) of a finite element method model of series-connected cells according to the invention.
Figure 13B:
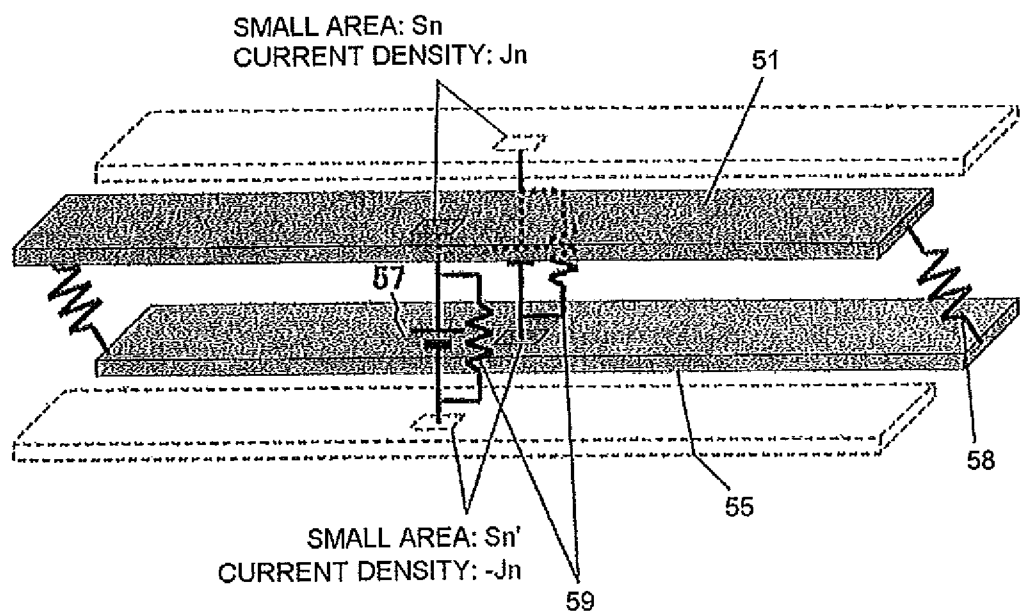

FIGS. 13A and 13B are views for explaining the concept (part 2) of a finite element method model of series-connected cells according to the invention. FIG. 13A shows a schematic view of a series-connection structure model in which unit cells having a large number of batteries 57 each produced by photoelectric operation between a small area Sn on the transparent electrode 51 and a small area Sn' on the rear electrode 55 are connected in series by series-connection wiring 58, similarly to FIG. 5A. Although the series-connection structure model shown in the schematic view of FIG. 13A has three unit cells, tens of unit cells are arranged practically. Because an enormous time is required for performing analysis while modeling all the unit cells and repeating calculation by tens to hundreds of times, it cannot be said that this is a realistic method.

On the other hand, FIG. 13B shows a schematic view of a state where a region from the transparent electrode 51 of a unit cell to the rear electrode 55 of an adjacent unit cell is extracted as one unit cell of an analysis model on the assumption that series connection continues infinitely on a model to be subjected to finite element method analysis in the schematic view of the series-connection structure model shown in FIG. 13A, so that one unit cell's calculation is performed based on the unit cell, similarly to FIG. 5B. Incidentally, in FIGS. 13A and 13B, it is conceived that this region contributes to electromotive force (battery 57) on the assumption that the small area on the transparent electrode (positive electrode side) 51 and the current density thereof are Sn and Jn, and likewise, the small area on the rear electrode (negative electrode side) 55 and the current density thereof are Sn' and −Jn. In addition, it is assumed that virtual resistance $R_L n$ (59) is present at each of opposite ends of a battery so that a leakage current $I_L n$ flows in the virtual resistance 59. In the above description, small-area cell I-V characteristic obtained by actual measurements or the like is set in the battery 57. In practical modeling, a specific shape is set in the series-connection wiring. Moreover, if the voltage applied to the battery in the same position of a unit cell, the current flowing in the battery and the leakage current are assumed to be equal to those in an adjacent unit cell, analysis can be executed without modeling at opposite ends of each battery.

When the model shown in FIG. 13B is now used for analyzing an electrode pattern (model 1) as shown in FIG. 6, a leakage current occurrence place and a leakage coefficient (A/V or A/mm/V or A/mm$^2$/V; these will be described later) are set from the input processing portion 11 of the finite element method analysis model construction device shown in FIG. 1 so that the same calculation as in FIG. 5B is performed. In the inside of calculation, conversion into [virtual resistance] is performed based on the set leakage coefficient and the simple Ohm's law so that the [virtual resistance] is incorporated in the model. Incidentally, the place where leakage occurs varies according to the production method or the like. First, for the sake simplification, a calculation result in the case where leakage is set on the whole power generation surface is shown as an example in FIG. 15 while the calculation result is superposed on a calculation result in the case where there is no leakage. Consequently, it is apparent that a qualitatively proper result that fill factor (FF) further deteriorates and Voc (open end voltage) is lowered is obtained.

Although [virtual resistance] may be set directly, a coefficient (referred to as "leakage coefficient" here) expressing a leakage current per unit voltage may be inputted practically and [virtual resistance] may be set to be equal to 1 V/[leakage coefficient] so that the leakage current obtained by actual measurements can be used as it is easily. A value per unit voltage (A/V) may be used simply as the leakage coefficient or a value per unit length per unit voltage (A/mm/V) or a value per unit area per unit voltage (A/mm$^2$/V) may be used as the leakage coefficient.

Figure 16:
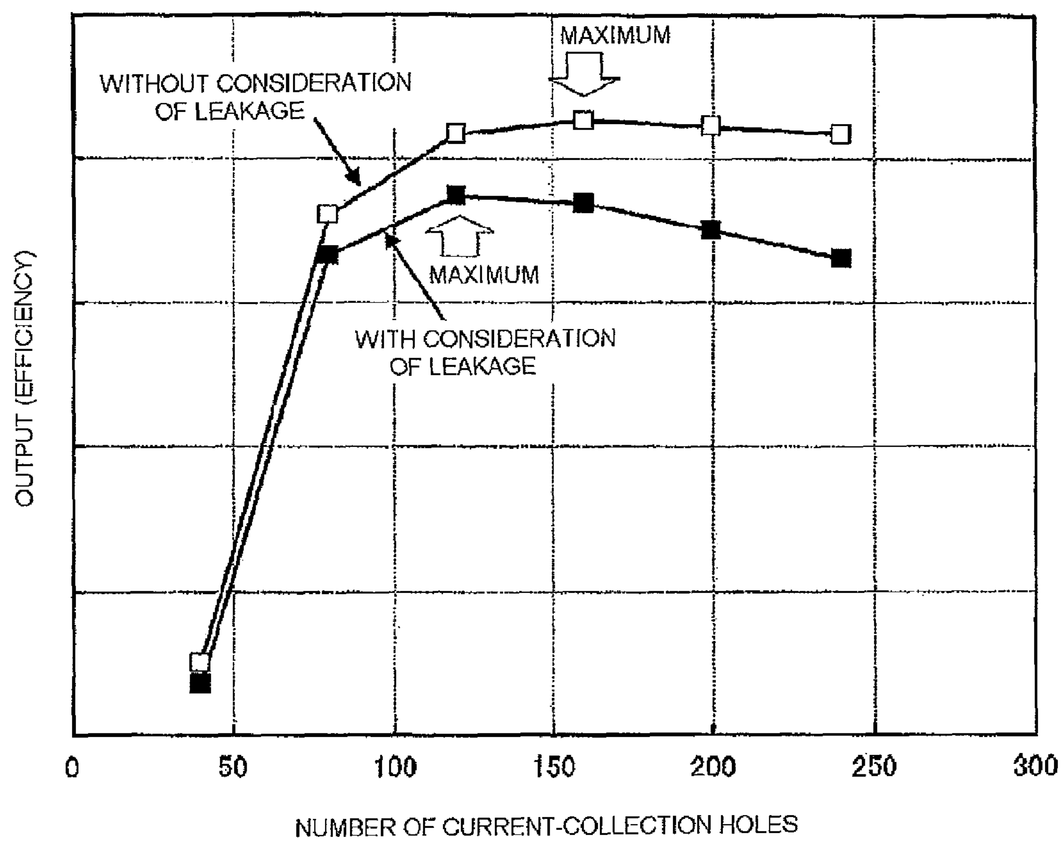
FIG. 16 is a graph showing an analysis result of output (efficiency) versus the number of current-collection holes calculated with consideration of leakage or without consideration of leakage based on the finite element method model (part 2) shown in FIG. 11.

Then, the electrode pattern (model 2) as shown in FIG. 11 is subjected to the same calculation with the number of holes (or the number of columns of holes is also changed) as a parameter, so that efficiency (output) is compared. FIG. 16 shows the calculation result. On this occasion, setting proportional to the circumferential length of each current-collection hole is selected as the leakage current. An average per current-collection hole circumference 1 mm (A/mm/V) obtained from a large number of actually measured results is used as a coefficient in occurrence of a leakage current. It is apparent from the graph shown in FIG. 16 that the optimum pattern designing value varies according to whether the leakage current is considered or not.

Figure 14:
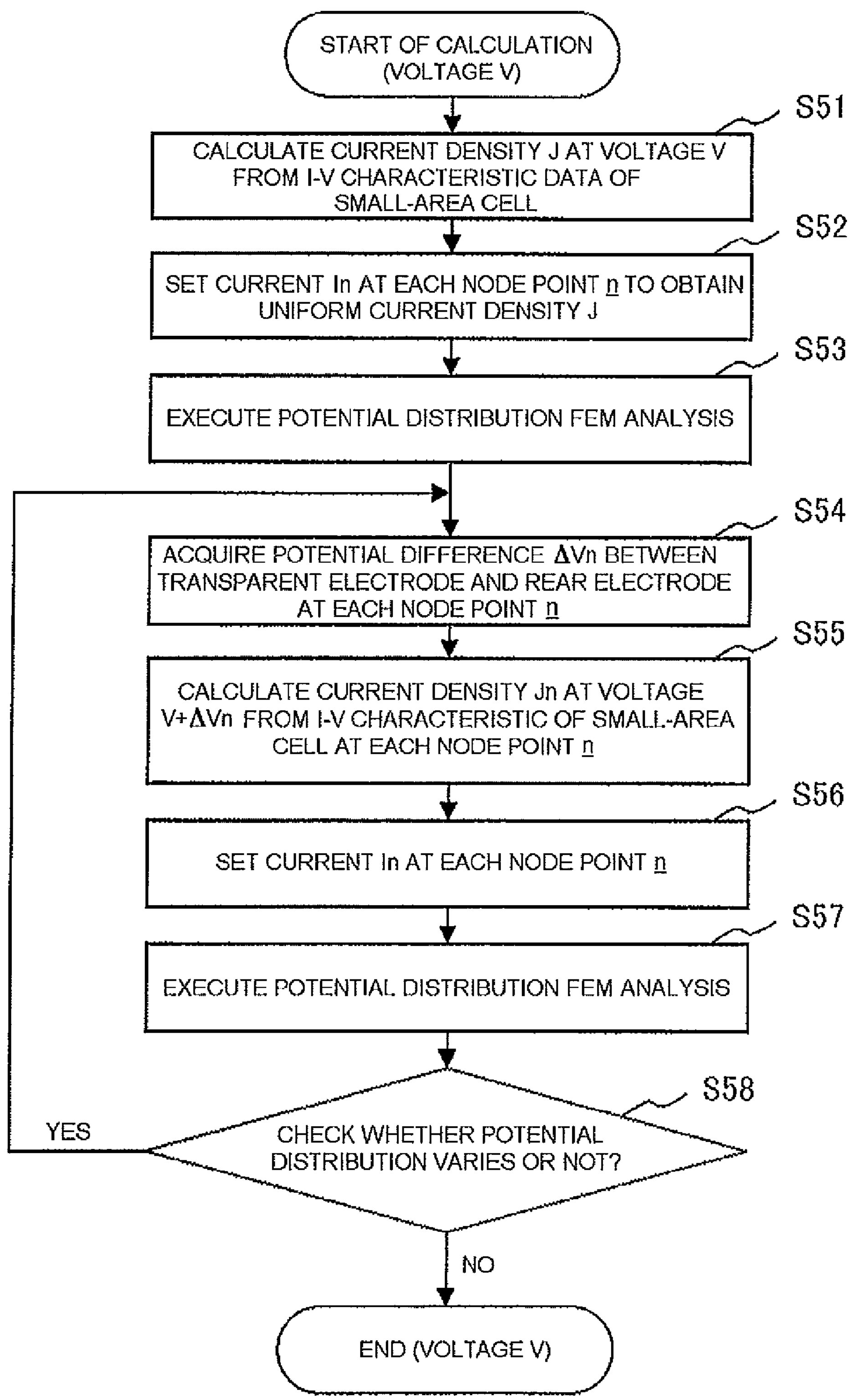
FIG. 14 is a flowchart showing a potential distribution analysis procedure (part 2) executed by the finite element method analysis arithmetic operation device shown in FIG. 1.

FIG. 14 is a flowchart showing a potential distribution analysis procedure (part 2) executed by the finite element method analysis arithmetic operation device shown in FIG. 1. The potential distribution analysis procedure executed by the finite element method analysis arithmetic operation device 20 for repeatedly calculating a potential distribution while giving a current load will be described with reference to FIG. 14, similarly to FIG. 4. In FIG. 14, step is abbreviated to "S". At start of the potential distribution analysis procedure, current density J (=f(V)) of the transparent electrode and rear electrode at a voltage V given to the battery and leakage current $I_L$n at each node point n in consideration of virtual resistance $R_L$n at the node point $\bar{n}$ at the voltage V given to the battery ($I_L$n=V/$R_L$n) are calculated from I-V characteristic data of a small-area cell read by the I-V characteristic data reading portion 21 for shape data of an analysis model stored in the shape data storage portion 3 (step S51). Then, current In (In=J*Sn−$I_L$n or In'=−(J*Sn−$I_L$n)) is set in accordance with each node point n based on area data Sn allotted to the node point to obtain $\bar{\text{u}}$niform current density J (step S52). Then, potential distribution FEM analysis is executed for all shape data stored in the shape data storage portion 3 (step S53).

In next step S54, potential difference ΔVn between the transparent electrode and the rear electrode is acquired in accordance with the node point n. Then, current density Jn (=f(V+ΔVn)) at a voltage V+ΔV$\bar{\text{n}}$ and leakage current $I_L$n in consideration of virtual resistance $R_L$ at the given voltage V+ΔVn ($I_L$n=(V+ΔVn)/$R_L$n) are calculated from I-V characteristic of the small-area cell in accordance with each node point n (step S55). Then, current In (In=Jn*Sn−$I_L$n or In'=−(Jn*S$\bar{\text{n}}$−$I_L$n)) is set in accordance with each node point n based on area data Sn allotted to the node point to obtain th$\bar{\text{e}}$ current density Jn (step S56). Then, potential distribution FEM analysis is executed for all shape data stored in the shape data storage portion 3 (step S57). For potential distribution analysis, a current generated from the battery is given as a load to the transparent electrode and rear electrode of the finite element method model. On the assumption that each battery is independent in accordance with each small area Sn (there is no current flowing in an adjacent small battery in the inside of the battery), the current distribution of the transparent electrode and the current distribution of the rear electrode can be set to be equal to each other (but different in sign) because the current flowing into a battery and the current flowing out of the battery are equal to each other in accordance with each small area Sn.

In next step S58, whether the potential distribution varies or not, is checked after the potential distribution FEM analysis in the step S57 is performed.

Figure 15:
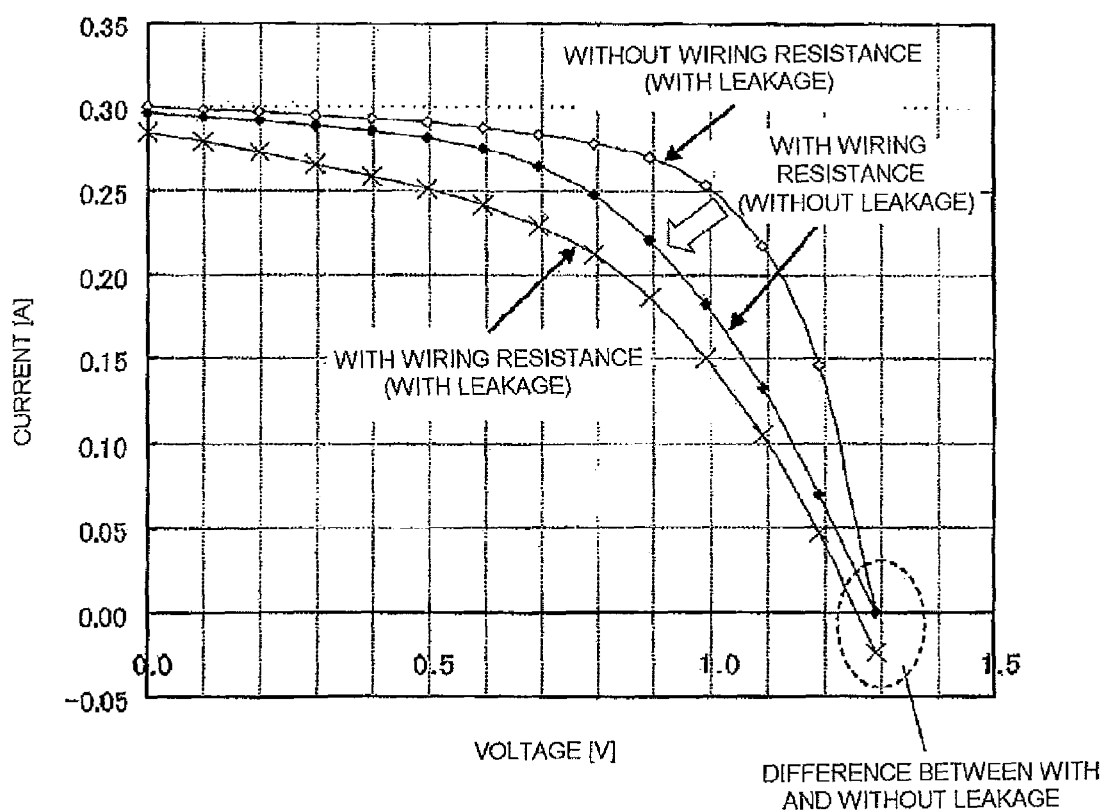
FIG. 15 is a graph showing an analysis result of each I-V characteristic analyzed with consideration of absence/presence of leakage based on the finite element method model (part 1) shown in FIG. 6.

When the potential distribution varies, processing goes back to the step S54 so that the steps S54 to S57 are repeated until the potential distribution does not vary. On the other hand, when the potential distribution does not vary, a series of calculations at the voltage V on I-V characteristic of the small-area cell is terminated. Though not shown, a series of processing shown in FIG. 14 is further continued while the position of voltage V on I-V characteristic of the small-area cell is changed, that is, while voltage V is changed. In this manner, the finite element method analysis arithmetic operation device 20 repeats the series of processing shown in FIG. 14 by loop calculation while changing the voltage V to thereby analyze current-voltage characteristic of the series-connected cells. FIG. 15 shows an example of the analysis result. Incidentally, maximum electric power, fill factor (FF), efficiency, etc. can be calculated suitably if the current-voltage characteristic is obtained.

The processing shown in FIG. 14 has been described above in the case where convergence is determined when the potential distribution does not vary. Alternatively, convergence may be determined based on current distribution, potential or current at a specific position, etc.

The leakage current will be described here more in detail. The leakage current means a current flowing between the transparent electrode and the rear electrode. A small amount of leakage current is generated in an actual solar battery because of defects and structural characteristic of film. When leakage is considered, a resistor element may be created as virtual resistance by which node points on the two electrodes are connected, as long as a direct model as shown in FIG. 13A can be created. However, when a model is created between the transparent electrode and the rear electrode of an adjacent unit cell connected to the transparent electrode by series-connection wiring as shown in FIG. 13B, it is difficult to connect node points by the resistor element because there is no electrode model to which leakage is given. A calculation equation for subtracting the same leakage current from the generated current at node points of the same position on the two electrodes may be set on the assumption that the leakage currents in the same position of the two electrodes are the same. Here, [leakage current]=[external voltage+potential difference between the two electrodes]/[virtual resistance]. When a resistor element is created as a finite element model, the step (not shown) of creating the resistor element may be added to the processing flow shown in FIG. 3. When the calculation equation is set, the step of setting the calculation equation (see calculation equations written in right portions of the steps S52, S56, etc. of FIG. 14) may be incorporated in the processing flow shown in FIG. 14.

FIG. 15 is a graph showing an analysis result of each I-V characteristic analyzed by use of the finite element method model (part 1) shown in FIG. 6 with consideration of presence/absence of leakage. In the case where there is no wiring resistance (without leakage), in the case where there is no wiring resistance (with leakage) and in the case where there is wiring resistance (with leakage), reduction in the generated current caused by a voltage drop is examined from the analysis results. When there is leakage, a phenomenon that fill factor (FF) more deteriorates to cause lowering of efficiency can be confirmed. Although extremely low virtual resistance is set in FIG. 15 to obtain easy understanding of the phenomenon, such a large difference between the presence of leakage and the absence of leakage does not appear practically as a phenomenon.

FIG. 16 is a graph showing an analysis result of output (efficiency) versus the number of current-collection holes calculated based on whether leakage is considered or not, by use of the finite element method model (part 2) shown in FIG. 11. In analysis without consideration of leakage, maximum output (efficiency) is obtained when the number of current-collection holes is 160. However, when virtual resistance increasing in proportion to the number of holes (hole contour length) is set, the leakage current increases as the number of holes increases. Accordingly, maximum output (efficiency) is obtained when the number of current-collection holes is 120. It is apparent that a more realistic design value can be obtained when leakage is considered.

Although description has been made in the case where an SCAF structure is taken as an example, any other structure may be included in the technical scope of the invention's thought because the structure can be dealt with likewise as long as the structure is a structure in which a large number of solar cells are connected in series.

What is claimed is:

1. An analysis and evaluation apparatus for estimating and evaluating characteristics of large-area series-connected solar battery cells from an actually measured current-voltage characteristic of a small-area single solar battery cell, the large-area series-connected cells having a plurality of unit solar battery cells connected in series and having a plurality of transparent electrodes, a plurality of rear electrodes, a plurality of current-collection holes and a plurality of series-connection holes formed therein, the analysis and evaluation apparatus comprising:

- a data storage unit configured to store shape parameters and material physical properties of current-collection holes, series-connection holes, a transparent electrode, a rear electrode of the large-area series-connected cells;
- an analysis model construction unit configured to read the shape parameters and material physical properties stored in the data storage unit and automatically construct and store a finite element method (FEM) model in consideration of electric resistance of the large-area series-connected cells;
- an analysis arithmetic operation unit configured to obtain a current at a voltage of initial calculation based on the actually measured current-voltage characteristic of the small-area single cell, set the current as a current load, calculate potential distributions of the transparent electrode and rear electrode of the large-area series-connected cells, correct the current load based on a difference between the potential distributions of the transparent electrode and the rear electrode, and the actually measured current-voltage characteristic of the small-area single cell, re-calculate the potential distributions based on the corrected current load, and repeat the re-calculation of the potential distributions until the potential distributions converge; and
- an evaluation unit configured to evaluate a calculation result converged by the analysis arithmetic operation unit as to whether the calculation result is a pattern exhibiting a desired current-voltage characteristic of the large-area series-connected cells.

2. The analysis and evaluation apparatus according to claim 1, wherein the analysis operation unit is configured to repeat the re-calculation of the potential distributions until a total current converges.

3. The analysis and evaluation apparatus according to claim 1, wherein the finite element method model constructed by the analysis model construction unit has an SCAF (Series Connection through Apertures formed on Film) structure.

4. The analysis and evaluation apparatus according to claim 1, wherein electrodes of the finite element method model, for which the current load is set by the analysis operation unit, are a transparent electrode of a unit cell and a rear electrode of an adjacent unit cell connected in series to the transparent electrode, so that calculation for one unit cell is performed based on the current load.

5. The analysis and evaluation apparatus according to claim 1, wherein the analysis model construction unit includes:

- a data reading portion configured to read shape parameter and material physical property data stored in the data storage unit;
- a hole shape and mesh forming portion configured to determine radius, virtual depth, number of lines, reference position, pitch, number of holes and mesh regarding the current-collection holes and series-connection holes of the large-area series-connected cells based on the shape parameters read by the data reading portion to thereby form hole shape and mesh of the finite element method analysis model; and
- an electrode shape and mesh forming portion configured to determine resistivities related with physical properties of the transparent electrode and the rear electrode, and direction-specific resistivities of the current-collection holes and mesh related with the transparent electrode and the rear electrode from the read shape parameter and material physical property data read by the data reading portion to thereby form electrode shape and mesh of the finite element method analysis model.

6. The analysis and evaluation apparatus according to claim 1, wherein the analysis operation unit includes:

- a current-voltage characteristic data reading portion configured to read the actually measured current-voltage characteristic data of the small-area single cell;
- an initial value calculation portion configured to acquire an initial value of potential difference between a transparent electrode and a rear electrode, both of which correspond to a node point of a plurality of node points, according to number data of the node point from the FEM analysis model data formed and stored by the analysis model construction unit, read a predetermined voltage from the current-voltage characteristic data of the small-area single cell read by the current-voltage characteristic data reading portion, give the predetermined voltage to the node point, calculate current density based on area data allotted to the node point in the transparent electrode and the rear electrode corresponding to the node point, set a particular current in accordance with each of the plurality of node points to uniformly obtain the calculated current density, and calculate particular potential distributions at initial values while giving the particular current as a particular current load; and a convergence calculation portion configured to acquire a potential difference between a transparent electrode and a rear electrode, which correspond to each node point, according to number data of each node point from the analysis model data formed and stored by the analysis model construction unit, give a further current obtained from the current-voltage characteristic data of the small-area cell read by the current-voltage characteristic data reading portion to each node point, re-calculates the particular potential distributions based on the further current, checks whether the particular potential distributions vary after the calculation of the particular potential distributions, and repeats the calculation until the particular potential distributions do not vary when the particular potential distributions vary.

7. The analysis and evaluation apparatus according to claim 6, wherein the convergence calculation portion is configured to repeat the calculation until a total current does not vary.

8. The analysis and evaluation apparatus according to claim 1, wherein the analysis operation unit is configured to set virtual resistance on whole surfaces, any ranges, any lines or any points of the transparent electrode and the rear electrode with respect to the finite element method model constructed by the analysis model construction unit, and calculate a leakage current flowing in the virtual resistance so that the calculation of the leakage current is included in calculation of the potential distributions.

9. The analysis and evaluation apparatus according to claim 1, wherein the analysis operation unit is configured to set virtual resistance on lines or vicinities thereof forming contours including holes of the transparent electrode and the rear electrode with respect to the finite element method model constructed by the analysis model construction unit, and calculate a leakage current flowing in the virtual resistance so that the calculation of the leakage current is included in calculation of the potential distributions.

10. A solar battery cell produced by use of a finite element method model constructed by the analysis and evaluation apparatus according to claim 1 and a pattern exhibiting desired current-voltage characteristic of large-area series-connected cells based on the finite element method model.

11. An analysis apparatus for estimating characteristics of large-area series-connected solar battery cells from an actually measured current-voltage characteristic of a small-area single solar battery cell, the large-area series-connected cells having a plurality of transparent electrodes, a plurality of rear electrodes, a plurality of current-collection holes and a plurality of series-connection holes, the analysis apparatus comprising:

a data storage unit configured to store shape parameters and material physical properties of current-collection holes, series-connection holes, a transparent electrode, a rear electrode of the large-area series-connected cells;

an analysis model construction unit configured to read the shape parameters and material physical properties stored in the data storage unit and automatically construct a finite element method (FEM) model in consideration of electric resistance of the large-area series-connected cells; and an analysis operation unit configured to obtain a current at a voltage of initial calculation based on the actually measured current-voltage characteristic of the small-area single cell, set the current as a current load, calculate potential distributions of the transparent electrode and the rear electrode of the large-area series-connected cells, correct the current load based on a difference between the potential distributions of the transparent electrode and the rear electrode, and the actually measured current-voltage characteristic of the small-area single cell, re-calculate the potential distributions based on the corrected current load, and repeat the re-calculation of the potential distributions until the potential distributions converge.

* * * * *